United States Patent
Kim et al.

(10) Patent No.: US 11,450,722 B2
(45) Date of Patent: Sep. 20, 2022

(54) DISPLAY DEVICE

(71) Applicant: Samsung Display Co., Ltd., Yongin-si (KR)

(72) Inventors: Doo Na Kim, Cheonan-si (KR); Keun Woo Kim, Seongnam-si (KR); Tae Wook Kang, Seongnam-si (KR); Do Kyeong Lee, Yongin-si (KR); Yong Su Lee, Seoul (KR); Jae Hwan Chu, Hwaseong-si (KR); Kwang Hyun Kim, Hwaseong-si (KR); Yeoung Keol Woo, Seongnam-si (KR); Yung Bin Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 207 days.

(21) Appl. No.: 16/871,523

(22) Filed: May 11, 2020

(65) Prior Publication Data

US 2021/0074785 A1   Mar. 11, 2021

(30) Foreign Application Priority Data

Sep. 9, 2019  (KR) .................. 10-2019-0111612

(51) Int. Cl.
*H01L 27/14* (2006.01)
*H01L 27/32* (2006.01)
(Continued)

(52) U.S. Cl.
CPC ...... *H01L 27/3262* (2013.01); *H01L 27/3265* (2013.01); *H01L 27/3276* (2013.01);
(Continued)

(58) Field of Classification Search
CPC ............ H01L 27/3262; H01L 27/3265; H01L 27/3276
(Continued)

(56) References Cited

U.S. PATENT DOCUMENTS

2018/0158406 A1   6/2018  Kim et al.
2021/0408190 A1*  12/2021  Yang .................. H01L 27/3262

FOREIGN PATENT DOCUMENTS

| CN | 108154846 A | | 6/2018 |
|---|---|---|---|
| KR | 20150101410 | * | 9/2015 |
| KR | 10-2018-0064619 A | | 6/2018 |

* cited by examiner

*Primary Examiner* — Tan N Tran
(74) *Attorney, Agent, or Firm* — Lewis Roca Rothgerber Christie LLP

(57) ABSTRACT

A display device includes: a first semiconductor layer on a first buffer layer, and including a first active layer; a first gate insulating layer on the first semiconductor layer, and covering the first active layer; a first conductive layer on the first gate insulating layer, and including a first gate electrode; a second conductive layer on the first conductive layer, and including a first source/drain electrode; a first interlayer insulating layer on the first conductive layer; a second semiconductor layer on the first interlayer insulating layer, and including a second active layer; a second gate insulating layer on the second semiconductor layer, and covering the second active layer; and a third conductive layer on the second gate insulating layer, and including a second gate electrode and a second source/drain electrode. The first gate insulating layer and the second gate insulating layer include different insulating materials from each other.

20 Claims, 17 Drawing Sheets

(51) Int. Cl.
  *H01L 29/786* (2006.01)
  *H01L 27/12* (2006.01)
  *H01L 29/423* (2006.01)
  *H01L 29/49* (2006.01)
  *H01L 29/51* (2006.01)

(52) U.S. Cl.
  CPC ........ *H01L 27/124* (2013.01); *H01L 27/1225* (2013.01); *H01L 27/1233* (2013.01); *H01L 27/1237* (2013.01); *H01L 27/1251* (2013.01); *H01L 27/1255* (2013.01); *H01L 29/42384* (2013.01); *H01L 29/4908* (2013.01); *H01L 29/518* (2013.01); *H01L 29/7869* (2013.01); *H01L 29/78675* (2013.01); *H01L 29/78696* (2013.01)

(58) Field of Classification Search
  USPC .............................. 257/40, 59, 72
  See application file for complete search history.

DT : 310, 330, 340, 350
ST1 : 410, 430, 440, 450

DT : 310, 330, 340, 350
ST1 : 410, 430, 440, 450

DISPLAY DEVICE

CROSS-REFERENCE TO RELATED APPLICATION

This application claims priority to and the benefit of Korean Patent Application No. 10-2019-0111612, filed on Sep. 9, 2019 in the Korean Intellectual Property Office, the disclosure of which is incorporated herein by reference in its entirety.

BACKGROUND

1. Field

Aspects of example embodiments of the present disclosure relate to a display device, and more particularly, to a display device that includes transistors disposed at (e.g., on) different layers from each other, and a plurality of gate insulating layers that are different from each other.

2. Description of the Related Art

The importance of display devices is increasing with the development of multimedia. Accordingly, various display devices, such as an organic light-emitting display (OLED) device, a liquid crystal display (LCD) device, and the like, are used.

Display devices are devices that display an image, and include a display panel such as an organic light-emitting display panel or a liquid crystal display panel. Among these display panels, the display device may include light-emitting elements as a light-emitting display panel. For example, a light-emitting diode (LED) may include an organic light-emitting diode (OLED) that uses an organic material as a fluorescent material, an inorganic light-emitting diode that uses an inorganic material as a fluorescent material, or the like.

Such a display device includes a display panel, a gate driving circuit, a data driving circuit, and a timing controller. The display panel includes data lines, gate lines, and pixels. Each of the pixels is formed at a crossing between each of the data lines and each of the gate lines. Each of the pixels uses a thin layer transistor as a switching element to receive data voltages from the data line when a gate signal is supplied to the gate line. Each of the pixels emits light with a desired or suitable brightness (e.g., a predetermined brightness) according to the data voltages.

Recently, a display device capable of displaying an image at a high resolution of ultra-high definition (UHD) has been released, and a display device capable of displaying an image at a high resolution of 8K ultra high definition (8K UHD) has been developed. UHD refers to 3840×2160 resolution, and 8K UHD refers to 7680×4320 resolution.

In the case of a high-resolution display device, as the number of pixels increases, a driving current of each of the pixels may decrease. Accordingly, a range of driving voltages of a driving transistor of each of the pixels may decrease.

The above information disclosed in this Background section is for enhancement of understanding of the background of the present disclosure, and therefore, it may contain information that does not constitute prior art.

SUMMARY

Aspects of example embodiments of the present disclosure are directed to a display device including different gate insulating layers depending on device characteristics of a driving transistor and a switching transistor.

It should be noted that aspects and features of the example embodiments of the present disclosure are not limited to the above-described aspects and features, and other aspects and features of the present disclosure will be apparent to those skilled in the art from the following description.

According to an exemplary embodiment of the present disclosure, a display device includes: a substrate; a first buffer layer on the substrate; a first semiconductor layer on the first buffer layer, and including a first active layer; a first gate insulating layer on the first semiconductor layer and the first buffer layer, and covering the first active layer; a first conductive layer on the first gate insulating layer, and including a first gate electrode; a second conductive layer on the first conductive layer, and including a first source/drain electrode; a first interlayer insulating layer on the first conductive layer; a second semiconductor layer on the first interlayer insulating layer, and including a second active layer; a second gate insulating layer on the second semiconductor layer, and covering the second active layer; and a third conductive layer on the second gate insulating layer, and including a second gate electrode and a second source/drain electrode. The first gate insulating layer and the second gate insulating layer include different insulating materials from each other.

In an exemplary embodiment, the first gate insulating layer may include a single layer including silicon oxide, and the second gate insulating layer may include: a first insulating layer including silicon oxide; and a second insulating layer on the first insulating layer, and including silicon nitride or silicon oxynitride.

In an exemplary embodiment, the first insulating layer of the second gate insulating layer may be in contact with the second active layer.

In an exemplary embodiment, a thickness of the first insulating layer may be greater than a thickness of the second insulating layer.

In an exemplary embodiment, the first gate insulating layer may include: a third insulating layer including silicon oxide; and a fourth insulating layer on the third insulating layer, and including silicon nitride or silicon oxynitride.

In an exemplary embodiment, the third insulating layer of the first gate insulating layer may be in contact with the first active layer.

In an exemplary embodiment, a hydrogen content of the fourth insulating layer may be lower than a hydrogen content of the second insulating layer.

In an exemplary embodiment, a width in one direction of a portion of the first active layer overlapping with the first gate electrode may be greater than a width in the one direction of a portion of the second active layer overlapping with the second gate electrode.

In an exemplary embodiment, a thickness of the first gate insulating layer may be greater than a thickness of the second gate insulating layer.

In an exemplary embodiment, a thickness of the first active layer may be greater than a thickness of the second active layer.

In an exemplary embodiment, the display device may further include a second buffer layer between the second active layer and the first interlayer insulating layer.

In an exemplary embodiment, the second semiconductor layer may further include a third active layer on the second buffer layer, and the second gate insulating layer may be on the third active layer.

In an exemplary embodiment, the third conductive layer may further include a third gate electrode and a third source/drain electrode on the second gate insulating layer and overlapping with at least a portion of the third active layer.

In an exemplary embodiment, the display device may further include a first protective layer between the second conductive layer and the first conductive layer, and between the second conductive layer and the first gate insulating layer, and the second conductive layer may be on the first protective layer, and may further include one electrode of a first capacitor at least a portion of which overlaps with the first gate electrode.

In an exemplary embodiment, the display device may further include: a second interlayer insulating layer on the third conductive layer; a data signal line on the second interlayer insulating layer; a second protective layer on the data signal line; and a conductive pattern on the second protective layer, and including at least a portion that overlaps with the data signal line.

According to an exemplary embodiment of the present disclosure, a display device includes: a substrate; a first buffer layer on the substrate; a first semiconductor layer on the first buffer layer, and including a first active layer; a first gate insulating layer on the first semiconductor layer and the first buffer layer, and covering the first active layer; a first conductive layer on the first gate insulating layer, and including a first gate electrode; a first interlayer insulating layer on the first conductive layer; a second semiconductor layer on the first interlayer insulating layer, and including a second active layer; a second gate insulating layer on the second semiconductor layer, and covering the second active layer; and a second conductive layer on the second gate insulating layer, and including a second gate electrode. A thickness of the first gate insulating layer is greater than a thickness of the second gate insulating layer.

In an exemplary embodiment, a thickness of the first active layer may be greater than a thickness of the second active layer.

In an exemplary embodiment, the first gate insulating layer may include a single layer including silicon oxide, and the second gate insulating layer may include: a first insulating layer including silicon oxide; and a second insulating layer on the first insulating layer, and including silicon nitride.

In an exemplary embodiment, the second insulating layer of the second gate insulating layer may include silicon oxynitride.

According to an exemplary embodiment of the present disclosure, a display device includes: a substrate; a driving transistor on the substrate, and including a first active layer, a first gate electrode, and a first source/drain electrode; a first interlayer insulating layer on the driving transistor; a first switching transistor on the first interlayer insulating layer, and including a second active layer, a second gate electrode, and a second source/drain electrode; a first gate insulating layer between the first active layer and the first gate electrode; and a second gate insulating layer between the second active layer and the second gate electrode. A width in one direction of a channel region of the first active layer is greater than a width in the one direction of a channel region of the second active layer, and a dielectric constant of the first gate insulating layer is lower than a dielectric constant of the second gate insulating layer.

BRIEF DESCRIPTION OF THE DRAWINGS

The above and other aspects and features of the present disclosure will become more apparent to those skilled in the art from the following detailed description of the exemplary embodiments thereof with reference to the attached drawings, in which.

DETAILED DESCRIPTION

Figure 1:
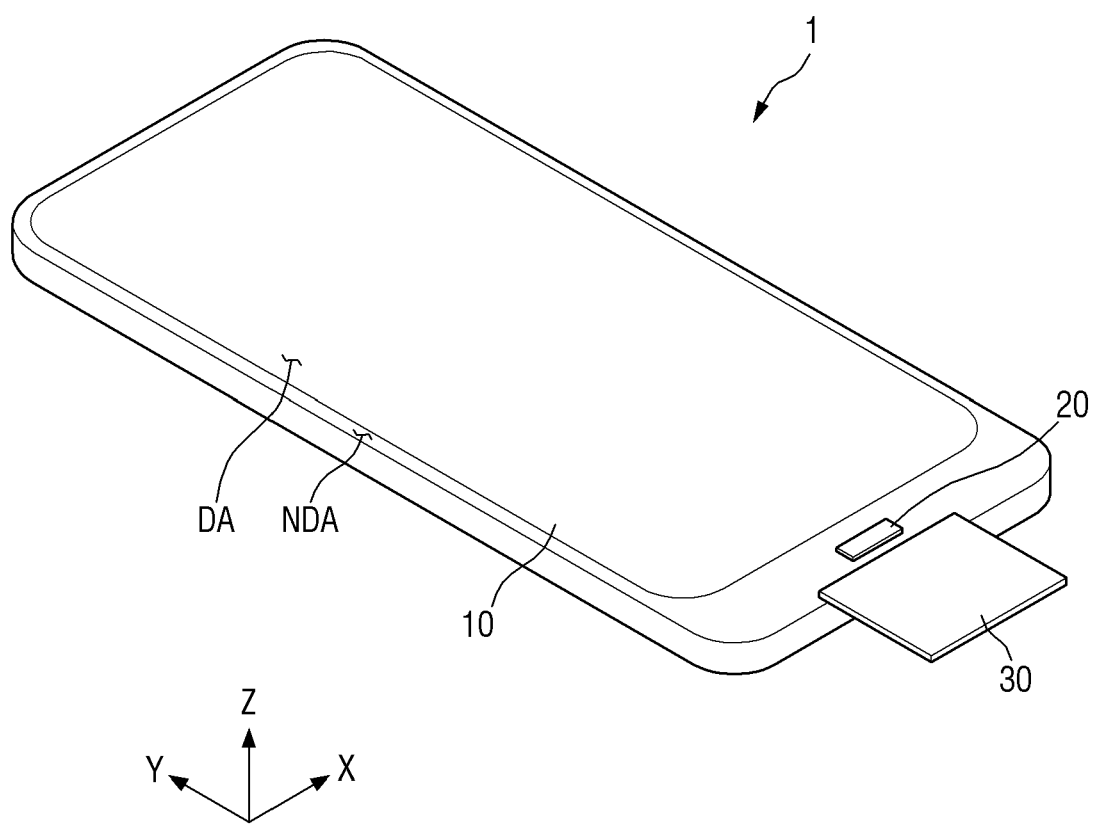
FIG. 1 is a perspective view illustrating a display device according to an exemplary embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," "left," "right," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device according to an exemplary embodiment.

Referring to FIG. 1, a display device 1 displays a video and/or a still image. The display device 1 may refer to any suitable electronic device that is provided with a display screen. For example, the display device 1 may include a television, a laptop computer, a monitor, digital signage, a device for Internet of Things, a mobile phone, a smartphone, a tablet personal computer (PC), an electronic watch, a smartwatch, a watch phone, a head-mounted display, a mobile communication terminal, an electronic notebook, an electronic book, a portable multimedia player (PMP), a navigation system, a game console, a digital camera, a camcorder, and/or the like, which may be provided with a display screen.

The display device 1 includes a display panel 10 that provides a display screen. Examples of the display panel 10 may include a light-emitting diode (LED) display panel, an organic light-emitting display panel, a quantum dot light-emitting display panel, a plasma display panel, a field emission display panel, and the like. Hereinafter, for convenience, an LED display panel is described as an example of the display panel 10, but the present disclosure is not limited thereto, and the display panel 10 may include (or may be) any suitable kind of display panel. More particularly, the display panel 10 may be mainly described as an organic light-emitting display (OLED) panel as an example hereinafter, but the present disclosure is not limited thereto.

As used in the present disclosure, the terms "above," "upper portion," "top," and "upper surface" refer to an upward direction of a thickness direction, for example, a Z-axis direction, relative to the display panel 10, and the terms "below," "lower portion," "bottom," and "lower surface" refer to a downward direction of the thickness direction, for example, a direction opposite to the Z-axis direction, relative to the display panel 10. Further, the terms "right," "left," "upper," and "lower" refer to directions when the display panel 10 is viewed in a plan view. As used herein, a plan view refers to a view from a plane that is parallel or substantially parallel to (or normal to) a top surface of the relevant element, component, layer, and/or the like (e.g., the top surface of the display panel 10, the display device 1, and/or the like). For example, the term "right" may refer to an X-axis direction, the term "left" may refer to a direction opposite to the X-axis direction, the term "upper" may refer to a Y-axis direction, and the term "lower" may refer to a direction opposite to the Y-axis direction.

The display device 1 may have various suitable shapes. For example, the display device 1 may have various suitable shapes, such as a rectangular shape of which lateral sides thereof are the longer sides (or long sides), a rectangular shape of which longitudinal sides thereof are the longer sides (or long sides), a square shape, a quadrangular shape of which corner portions (e.g., vertexes) thereof are rounded, other suitable polygonal shapes, a circular shape, and/or the like. A shape of a display area DA of the display device 1 may correspond to the shape of the display device 1. For example, the shape of the display area DA may have the same or substantially same shape (or similar shape) as an overall shape of the display device 1. In FIG. 1, the display device 1 and the display area DA are illustrated as having the rectangular shape of which the longitudinal sides thereof are the long sides, but the present disclosure is not limited thereto.

The display device 1 may include the display area DA and a non-display area NDA. The display area DA is an area in which an image may be displayed, and the non-display area NDA is an area in which an image may not be displayed. The display area DA may be referred to as an active area, and the non-display area NDA may be referred to as an inactive area.

In general, the display area DA may substantially occupy a center (e.g., a central area) of the display device 1. The display area DA may include a plurality of pixels PX. The plurality of pixels PX may be arranged in a matrix form. A shape of each of the pixels PX may be a rectangular shape or a square shape in a plan view, but the present disclosure is not limited thereto, and each of the pixels PX may have any suitable shape. For example, the shape of each of the pixels PX may be a rhombus shape of which sides thereof are inclined with respect to a first direction (e.g., the X-axis direction).

The non-display area NDA may be disposed around (e.g., a periphery of) the display area DA. For example, the non-display area NDA may completely or partially surround (e.g., around a periphery of) the display area DA. For example, when the display area DA has a rectangular shape, the non-display area NDA may be arranged to be adjacent to four sides of the display area DA. The non-display area NDA may define (e.g., may form) a bezel of the display device 1.

Figure 2:
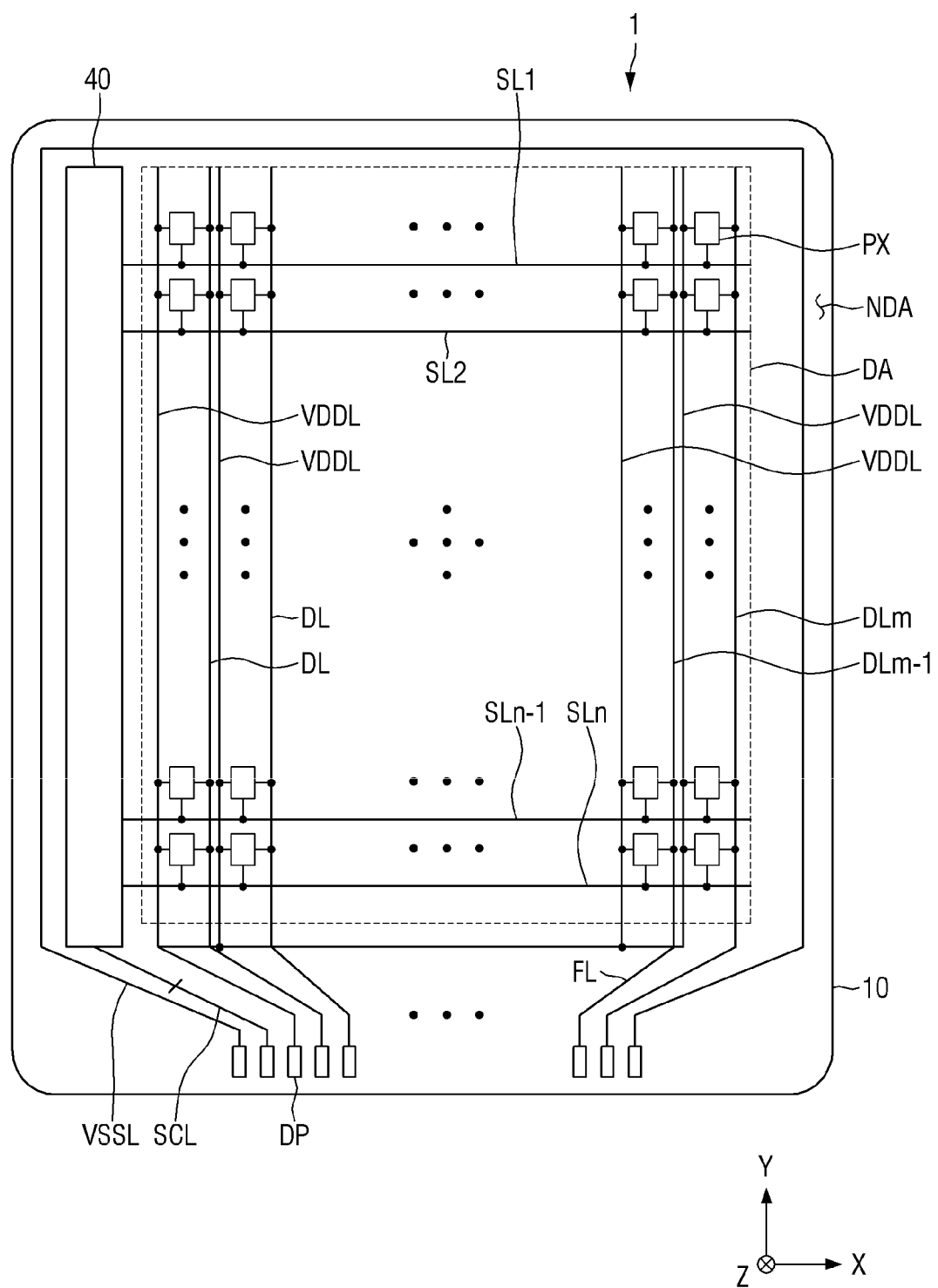
FIG. 2 is a plan view illustrating an example of the display device according to an exemplary embodiment.
Figure 3:
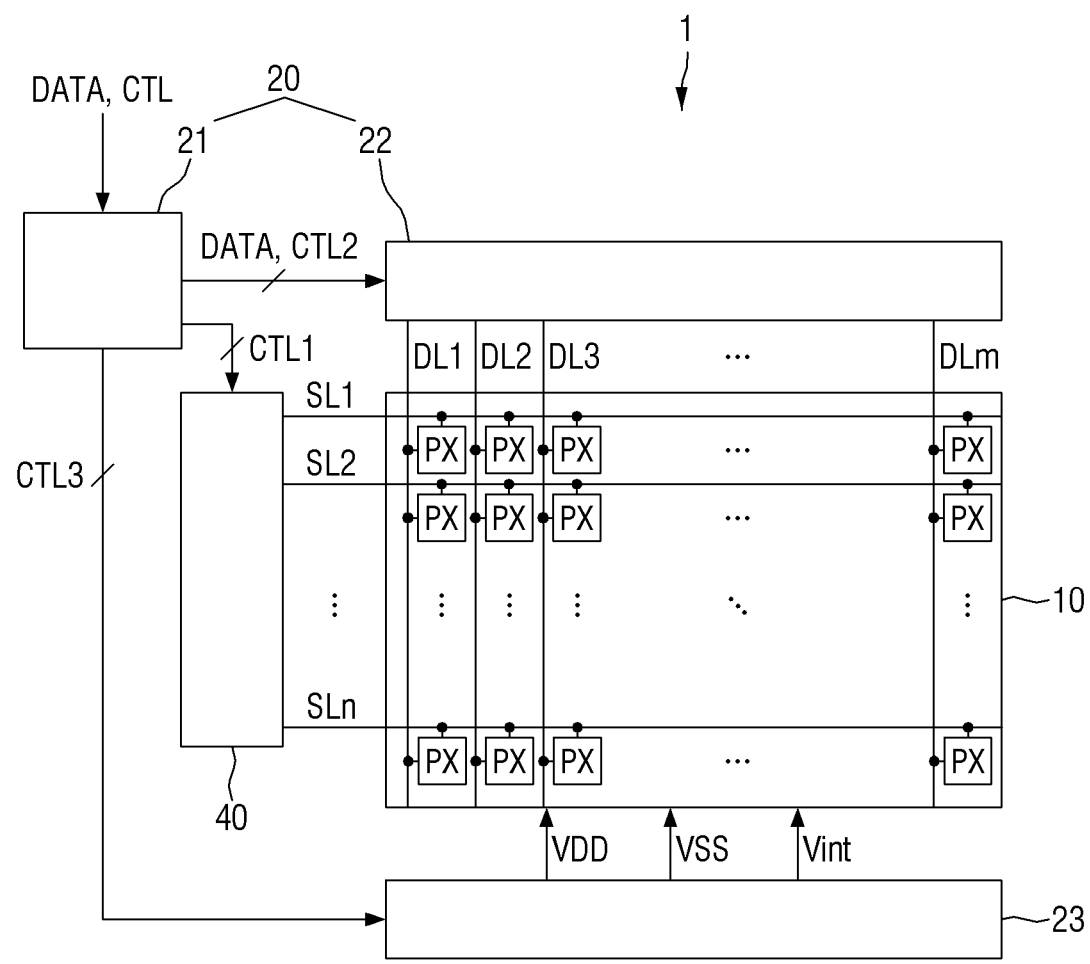
FIG. 3 is a block diagram illustrating the display device according to an exemplary embodiment.

FIG. 2 is a plan view illustrating an example of the display device according to an exemplary embodiment. FIG. 3 is a block diagram illustrating the display device according to an exemplary embodiment.

Referring to FIGS. 2 and 3 in association with FIG. 1, the display device 1 includes the display panel 10, a display driving circuit 20, and a circuit board 30.

The display panel 10 may be formed to have a rectangular-shaped flat surface that has short sides in the first direction (e.g., the X-axis direction) and long sides in a second direction (e.g., the Y-axis direction) crossing the first direction (e.g., the X-axis direction). A corner at which the short side in the first direction (e.g., the X-axis direction) meets (e.g., joins or merges with) the long side in the second direction (e.g., the Y-axis direction) may be formed to be rounded with a curvature (e.g., a predetermined curvature), or may be formed with a right angle. A planar shape (e.g., a shape in a plan view) of the display panel 10 is not limited to the rectangular shape, and may be formed to have various suitable shapes, for example, such as another polygonal shape, a circular shape, an elliptical shape, and/or the like. The display panel 10 may be formed to be flat, but the present disclosure is not limited thereto, and the display panel 10 may include curved surface portions that are formed at left and right ends thereof. For example, the display panel 10 (e.g., the curved surface portions thereof) may have a constant curvature or various curvatures. In addition, the display panel 10 may be formed to be flexible so as to be bendable, foldable, rollable, and/or the like.

The display panel 10 may include the display area DA including the plurality of pixels PX formed thereon to display an image, and the non-display area NDA that may define (or may be) a peripheral area of the display area DA. At (e.g., in or on) the display area DA, scan lines SL1 to SLn, data lines DL1 to DLm, first voltage lines VDDL, and a second voltage line VSSL, which are connected to the pixels PX, may be disposed in addition to the pixels PX. The scan lines SL1 to SLn may be disposed (e.g., may be formed) to extend in the first direction (e.g., the X-axis direction) and may be parallel to or substantially parallel to each other, and the data lines DL1 to DLm may be disposed (e.g., may be formed) to extend in the second direction (e.g., the Y-axis direction) that crosses the first direction (e.g., the X-axis direction) and may be parallel to or substantially parallel to each other. The first voltage lines VDDL may be formed to extend in the second direction (e.g., the Y-axis direction) in the display area DA and may be parallel to or substantially parallel to each other. The first voltage lines VDDL, which are parallel or substantially parallel to each other and formed to extend in the second direction (Y-axis direction), may be connected to each other at (e.g., in or on) the non-display area NDA.

Each of the pixels PX may be connected to one of the data lines DL1 to DLm, one of the first voltage lines VDDL, and at least one of the scan lines SL1 to SLn. In addition, each of the pixels PX may be electrically connected to the second voltage line VSSL. In FIG. 2, each of the pixels PX is illustrated as being connected to one scan line, one data line, and one first voltage line VDDL, but the present disclosure is not limited thereto.

Each of the pixels PX may include a plurality of transistors, a light-emitting element, and a capacitor. The plurality of transistors may include a driving transistor and at least one switching transistor. The driving transistor may be configured to control a driving current, which flows through the light-emitting element according to a data voltage applied to a gate electrode of the driving transistor. The plurality of transistors may include (or may be) thin-film transistors. The light-emitting element may emit light according to the driving current of the driving transistor. The capacitor may serve to maintain or substantially maintain (e.g., constantly maintain) the data voltage applied to the gate electrode of the driving transistor.

The non-display area NDA may be defined as a peripheral area of the display area DA. At (e.g., in or on) the non-display area NDA, a scan driver 40 for applying scan signals to the scan lines SL1 to SLn, fan-out lines FL respectively connected to pads DP, and the pads DP connected to the circuit board 30 may be disposed. The pads DP may be disposed at one side edge of the display panel 10. For example, as shown in FIG. 2, the pads DP may be disposed at one of the short sides of the display panel 10, but the present disclosure is not limited thereto.

The scan driver 40 may be connected to the pads DP through a plurality of scan control lines SCL. Thus, the scan driver 40 may receive a scan control signal CTL1 from the display driving circuit 20 through the plurality of scan control lines SCL. The scan driver 40 may generate the scan signals according to the scan control signal CTL1, and may output (e.g., may sequentially output) the scan signals to the scan lines SL1 to SLn.

The scan driver 40 may include a plurality of thin-film transistors. The scan driver 40 may be formed at (e.g., on) the same layer as or a different layer from that of the thin-film transistors of the pixels PX.

The scan driver 40 is illustrated in FIG. 2 as being formed at (e.g., in or on) the non-display area NDA at one side of the display area DA, for example, at a left side of the display area DA, but the present disclosure is not limited thereto. For example, the scan driver 40 may be formed at (e.g., in or on) the non-display area NDA at two sides (e.g., two opposite sides) of the display area DA, for example, at the left side and the right side of the display area DA.

The display driving circuit 20 may be disposed at (e.g., in or on) the display panel 10 through, for example, a chip on glass (COG) method, a chip on plastic (COP) method, or an ultrasonic bonding method. As another example, the display driving circuit 20 may be formed of an integrated circuit (IC), and may be disposed on the circuit board 30. As illustrated in FIG. 3, the display driving circuit 20 may include a timing controller 21 and a data driver 22.

The timing controller 21 receives video data (e.g., digital video data) DATA and timing signals CTL. The timing controller 21 may generate the scan control signal CTL1 for controlling an operation timing of the scan driver 40, and a data control signal CTL2 for controlling an operation timing of the data driver 22 according to the timing signals CTL. The timing controller 21 may also generate a power control signal CTL3 for controlling an operation timing of a power supply circuit 23. The timing controller 21 may output the scan control signal CTL1 to the scan driver 40 through the plurality of scan control lines SCL, and may output the video data (e.g., the digital video data) DATA and the data control signal CTL2 to the data driver 22. The timing controller 21 may output the power control signal CTL3 to the power supply circuit 23.

The data driver 22 converts the video data (e.g., the digital video data) to data voltages (e.g., analog positive/negative data voltages), and outputs the data voltages (e.g., the analog positive/negative data voltages) to the data lines DL1 to DLm through the fan-out lines FL. When the pixels PX are selected according to the scan signals of the scan driver 40, the data voltages are supplied to the selected pixels PX.

The power supply circuit 23 may be formed of an IC, and may be disposed on the circuit board 30. The power supply circuit 23 may generate a first voltage VDD according to an input power and the power control signal CTL3, and may supply the first voltage VDD to the first voltage line VDDL. The power supply circuit 23 may generate a second voltage VSS, and may supply the second voltage VSS to the second voltage line VSSL. Further, the power supply circuit 23 may generate an initialization voltage, and may supply the initialization voltage to an initialization voltage line Vint. The power supply circuit 23 may further generate various driving voltages that are used for driving the display device 1, in addition to the first voltage VDD, the second voltage VSS, and the initialization voltage. The power supply circuit 23 may include a DC-DC converter.

The circuit board 30 may be connected to (e.g., may be attached onto) the pads DP using an anisotropic conductive film. Accordingly, the circuit board 30 may be electrically connected to the pads DP. The circuit board 30 may be a flexible printed circuit board, a printed circuit board, a flexible film such as a chip on film, and/or the like.

Figure 4:
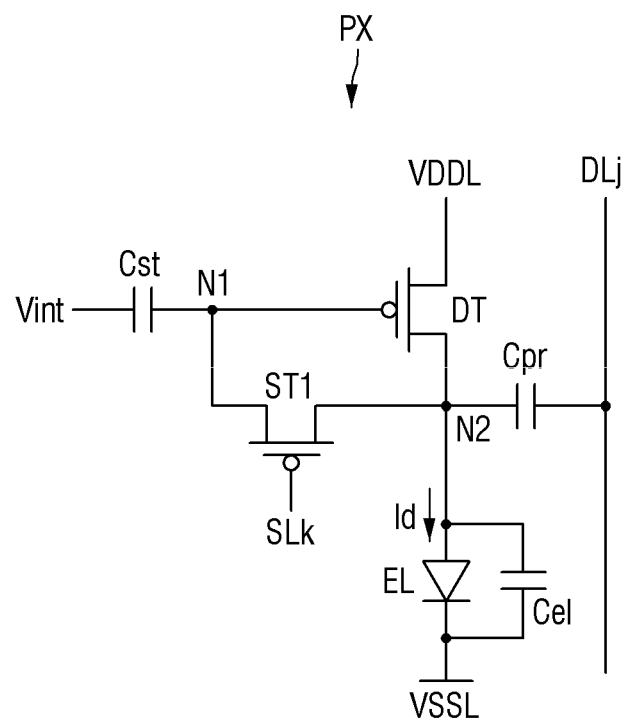
FIG. 4 is an equivalent circuit diagram illustrating a pixel of FIG. 2.

FIG. 4 is an equivalent circuit diagram illustrating a pixel of FIG. 2.

Referring to FIG. 4, the pixel PX may be connected to a k-th scan line SLk (where k is a positive integer), a j-th data line DLj (where j is a positive integer), the initialization voltage line Vint to which the initialization voltage is applied, the first voltage line VDDL to which the first voltage VDD is applied, and the second voltage line VSSL to which the second voltage VSS is applied. The pixel PX may include a light-emitting element EL, a driving transistor DT, a first switching transistor ST1, a first capacitor Cst, and a second capacitor Cpr. FIG. 4 illustrates that the pixel PX has a two transistor-two capacitor (2T2C) structure including one driving transistor DT, one switching transistor ST1, and two capacitors Cst and Cpr. However, the present disclosure is not limited thereto, and each pixel PX may include a greater number (e.g., a larger number) of transistors and/or capacitors.

In addition, FIG. 4 illustrates that the driving transistor DT and the first switching transistor ST1 are formed of P-type metal-oxide-semiconductor (PMOS) transistors, but the present disclosure is not limited thereto. For example, each of the driving transistor DT and the first switching transistor ST1 may be formed of an N-type metal-oxide-semiconductor (NMOS) transistor, or one of the driving transistor DT and the first switching transistor ST1 may be formed of a PMOS transistor and the other remaining one thereof may be formed of an NMOS transistor. The PMOS transistor is turned on by a gate-on voltage that is lower than a gate-off voltage, and the NMOS transistor is turned on by a gate-on voltage that is higher than a gate-off voltage.

The light-emitting element EL emits light according to a driving current Id of the driving transistor DT. For example, an emission luminance of the light-emitting element EL may be proportional to the driving current Id.

As an example of the light-emitting element EL, an organic light-emitting diode (OLED) including a first electrode, a second electrode, and an organic light-emitting layer disposed between the first electrode and the second electrode may be used. As another example of the light-emitting element EL, instead of the organic light-emitting diode (OLED), an inorganic light-emitting diode including a first electrode, a second electrode, and an inorganic semiconductor disposed between the first electrode and the second electrode may be used. As other examples of the light-emitting element EL, instead of the organic light-emitting diode (OLED), a quantum dot light-emitting diode including a first electrode, a second electrode, and a quantum dot light-emitting layer disposed between the first electrode and the second electrode, or a micro light-emitting diode may be used.

A first electrode of the light-emitting element EL may be connected to a second node N2, and a second electrode thereof may be connected to the second voltage line VSSL. A parasitic capacitance Cel may be formed between the first electrode and the second electrode of the light-emitting element EL.

The driving transistor DT may be disposed between the first voltage line VDDL and the second node N2. The driving transistor DT may control a drain-source current (hereinafter, referred to as a driving current) Id according to a data voltage applied to the gate electrode thereof. In the driving transistor DT, the driving current Id flowing through a channel may be proportional to a square of a difference between a voltage Vgs and a threshold voltage. The voltage Vgs may correspond to a voltage between the gate electrode of the driving transistor DT and a first electrode of the driving transistor DT.

The first switching transistor ST1 is disposed between a first node N1 and the second node N2. The first switching transistor ST1 is turned on by a k-th scan signal of the k-th scan line SLk, and connects the first node N1 to the second node N2. A gate electrode of the first switching transistor ST1 may be connected to the k-th scan line SLk, a first electrode of the first switching transistor ST1 may be connected to the first node N1, and a second electrode of the first switching transistor ST1 may be connected to the second node N2.

When the first switching transistor ST1 is turned on, the gate electrode and the second electrode of the driving transistor DT are connected to each other, and thus, the driving transistor DT operates as a diode. In other words, when the first switching transistor ST1 is turned on, the first switching transistor ST1 may diode-connect the driving transistor DT.

When the first electrodes of the driving transistor DT and the first switching transistor ST1 are source electrodes, the second electrodes of the driving transistor DT and the first switching transistor ST1 may be drain electrodes. When the first electrodes of the driving transistor DT and the first switching transistor ST1 are drain electrodes, the second electrodes of the driving transistor DT and the first switching transistor ST1 may be source electrodes.

As will be described below, active layers of the driving transistor DT and the first switching transistor ST1 may be formed of polysilicon, amorphous silicon, or an oxide semiconductor. However, the present disclosure is not limited thereto, and the active layer of one of the driving transistor DT and the first switching transistor ST1 may be formed of polysilicon, and the active layer of the other remaining one of the driving transistor DT and the first switching transistor ST1 may be formed of an oxide semiconductor. For example, the active layer of the driving transistor DT may be formed of polysilicon, and the active layer of the first switching transistor ST1 may be formed of an oxide semiconductor.

The first capacitor Cst is disposed between the first node N1 and the initialization voltage line Vint. For example, the first capacitor Cst may include a first capacitor electrode connected to the first node N1, and a second capacitor electrode connected to the initialization voltage line Vint. The first capacitor Cst may be disposed between the gate electrode of the driving transistor DT and the initialization voltage line Vint, and may serve to maintain or substantially maintain (e.g., constantly maintain) a voltage applied to the gate electrode of the driving transistor DT.

The second capacitor Cpr is disposed between the second node N2 and the j-th data line DLj. For example, the second capacitor Cpr may include a first capacitor electrode connected to the second node N2, and a second capacitor electrode connected to the j-th data line DLj. The capacitance of the second capacitor Cpr may be greater than (e.g., higher than) the capacitance of the first capacitor Cst.

The first node N1 may be a contact point between the gate electrode of the driving transistor DT, the first capacitor electrode of the first capacitor Cst, and the first electrode of the first switching transistor ST1. The second node N2 may be a contact point between the second electrode of the first switching transistor ST1, the first capacitor electrode of the second capacitor Cpr, the second electrode of the driving transistor DT, and the first electrode of the light-emitting element EL.

Hereinafter, structures and dispositions (e.g., arrangements) of the transistors that are disposed in each of the pixels PX will be described in more detail.

Figure 5:
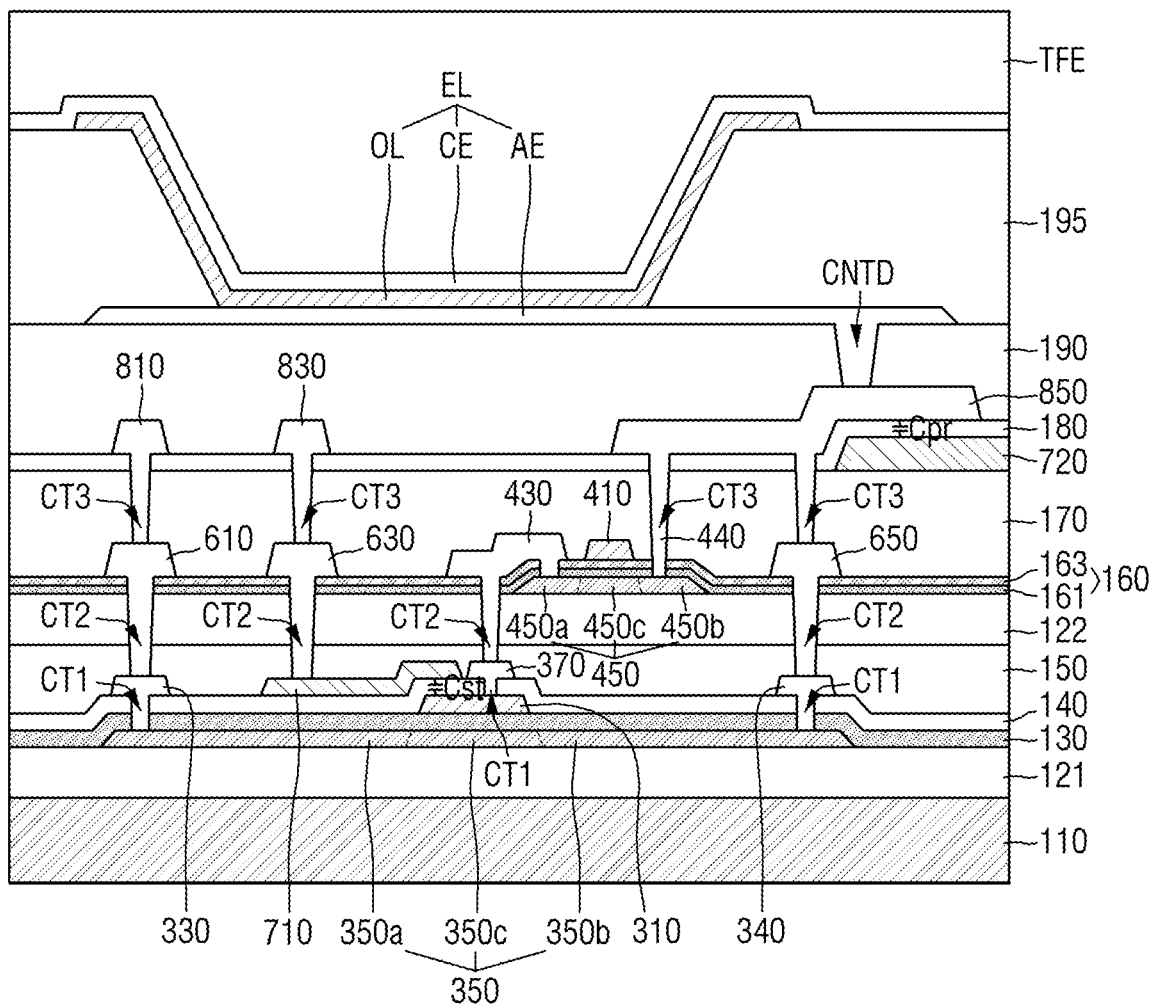
FIG. 5 is a cross-sectional view illustrating a portion of the display device according to an exemplary embodiment.

FIG. 5 is a cross-sectional view illustrating a portion of the display device according to an exemplary embodiment.

In FIG. 5, a cross-section of a portion of the pixel PX of the display device 1 including the driving transistor DT and the first switching transistor ST1 is illustrated. However, the display device 1 is not limited to the cross-sectional view shown in FIG. 5, and a larger number of components may be disposed at (e.g., in or on) the display device 1.

Referring to FIG. 5, the display device 1 may include a first substrate 110, a plurality of conductive layers, a plurality of semiconductor layers, and a plurality of insulating layers. For example, the display device 1 includes a first semiconductor layer, a first conductive layer, a second conductive layer, a second semiconductor layer, a third conductive layer, a fourth conductive layer, and a fifth conductive layer as the conductive layers and the semiconductor layers thereof. Each of the plurality of conductive layers and each of the plurality of semiconductor layers may be included in (e.g., may constitute or may be a part of) the driving transistor DT and the first switching transistor ST1. In addition, the display device 1 may include a first buffer layer 121, a first gate insulating layer 130, a first protective layer 140, a first interlayer insulating layer 150, a second buffer layer 122, a second gate insulating layer 160, a second interlayer insulating layer 170, a second protective layer 180, and a first planarizing film 190 as the plurality of insulating layers thereof.

In more detail, the driving transistor DT includes a first active layer 350, a first gate electrode 310, and source/drain electrodes 330 and 340. The first switching transistor ST1 includes a second active layer 450, a second gate electrode 410, and source/drain electrodes 430 and 440. According to an exemplary embodiment, the plurality of transistors of the display device 1, for example, the driving transistor DT and the first switching transistor ST1, may be disposed at (e.g., on) different layers from each other. For example, as illustrated in FIG. 5, the first switching transistor ST1 may be positioned above the driving transistor DT, and the second active layer 450 of the first switching transistor ST1 may overlap with the first active layer 350 of the driving transistor DT in a thickness direction (e.g., the Z-axis direction). Thus, when the display device 1 includes a large number of pixels PX, channel regions of the transistors may each have a width greater than or equal to a predetermined level. Accordingly, excellent device characteristics may be secured in the transistors, and the display device 1 may have high-resolution display quality.

In particular, because the driving transistor DT and the first switching transistor ST1 are disposed at (e.g., in or on) different layers from each other, the gate insulating layer between the gate electrode and the active layer of the driving transistor DT may be different from the gate insulating layer between the gate electrode and the active layer of the first switching transistor ST1. The display device 1 according to an exemplary embodiment may include a plurality of different gate insulating layers, and may control materials, thicknesses, and/or the like of the gate insulating layers to secure or improve device characteristics desired for the driving transistor DT and the first switching transistor ST1.

FIG. 5 illustrates that the driving transistor DT and the first switching transistor ST1 of the pixel PX are each formed in a coplanar structure. The coplanar structure has a top-gate structure in which a gate electrode is formed above an active layer. However, the present disclosure is not limited thereto, and the driving transistor DT and the first switching transistor ST1 of each pixel PX may each have a bottom-gate structure in which a gate electrode is formed below an active layer. Hereinafter, the driving transistor DT and the first switching transistor ST1 will be described in more detail.

The first substrate 110 may provide a region at (e.g., in or on) which the driving transistor DT and the first switching transistor ST1 are formed. The first substrate 110 may include (e.g., may be made of) plastic or glass.

The first buffer layer 121 is disposed on the first substrate 110. The first buffer layer 121 may be formed on the first substrate 110 to protect the transistors of the pixel PX and an organic light-emitting layer OL of the light-emitting element EL from moisture that may penetrate through the first substrate 110, which may be vulnerable to moisture permeation. The first buffer layer 121 may be formed of a plurality of inorganic layers that are alternately stacked. For example, the first buffer layer 121 may be formed to have a multi-layered structure in which one or more inorganic layers from among a silicon oxide layer (SiOx), a silicon nitride layer (SiNx), and a silicon oxynitride (SiON) are alternately stacked.

The first semiconductor layer is disposed on the first buffer layer 121. The first semiconductor layer includes the first active layer 350 of the driving transistor DT. The first active layer 350 may include (e.g., may be made of) polycrystalline silicon, single-crystal silicon, low-temperature polycrystalline silicon, amorphous silicon, or an oxide semiconductor.

The first active layer 350 may include a first conductive region 350a, a second conductive region 350b, and a channel region 350c. The channel region 350c may be disposed between the first conductive region 350a and the second conductive region 350b. The first conductive region 350a and the second conductive region 350b may be in contact with the source/drain electrodes 330 and 340 of the driving transistor DT, which will be described below.

The first gate insulating layer 130 may be disposed on the first semiconductor layer. The first gate insulating layer 130 may be disposed on the first buffer layer 121 including at least the first active layer 350. In more detail, the first gate insulating layer 130 may be disposed on a portion of the first buffer layer 121 on which the first active layer 350 is not disposed, and on a region in which the first gate insulating layer 130 overlaps with the channel region 350c of the first active layer 350. In FIG. 5, the first gate insulating layer 130 is illustrated as being disposed to cover an entirety of the first buffer layer 121 including an upper surface and side surfaces of the first active layer 350, but the present disclosure is not limited thereto. For example, the first gate insulating layer 130 may be disposed only on the upper surface of the first active layer 350, and thus, may be disposed only between the first gate electrode 310 and the first active layer 350, which will be described in more detail below.

The first gate insulating layer 130 may include (e.g., may be made of) an inorganic material, for example, such as silicon oxide (SiOx), silicon nitride (SiNx), or a stacked structure thereof. In FIG. 5, the first gate insulating layer 130 is illustrated as including (e.g., being formed of) one layer, but the present disclosure is not limited thereto. As described above, in the display device 1 according to an exemplary embodiment, the driving transistor DT and the first switching transistor ST1 may be disposed at (e.g., in or on) different layers from each other so that the display device 1 includes a plurality of gate insulating layers. The material, thickness, and/or the like of the first gate insulating layer 130 may be variously modified (e.g., variously selected) to secure or improve device characteristics desired for the driving transistor DT. Detailed descriptions thereof will be described further below.

The first conductive layer is disposed on the first gate insulating layer 130. The first conductive layer includes the first gate electrode 310 of the driving transistor DT. The first gate electrode 310 may overlap with at least a portion of the first active layer 350 with the first gate insulating layer 130 interposed therebetween. For example, as illustrated in FIG. 5, a width of the first gate electrode 310, which is measured in one direction (e.g., in the X-axis direction) crossing the thickness direction (e.g., the Z-axis direction), may be smaller than a width of the first active layer 350, which is measured in the one direction. The first gate electrode 310 may be disposed so as to overlap with at least the channel region 350c of the first active layer 350, and the width of the first gate electrode 310, which is measured in the one direction, may be equal to or substantially equal to a width of the channel region 350c of the first active layer 350, which is measured in the one direction.

The first gate electrode 310 of the first conductive layer may be formed as a single layer structure or as a multi-layered structure that includes (e.g., is made of) at least one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The first protective layer 140 is disposed on the first conductive layer. The first protective layer 140 may be disposed so as to cover the first gate insulating layer 130 and the first gate electrode 310. The first protective layer 140 may include (e.g., may be formed of), for example, SiOx, SiNx, or a stacked structure thereof. First contact holes CT1, which extend (e.g., pass) through the first protective layer 140 to partially expose the first active layer 350 and the first gate electrode 310, may be formed in the first protective layer 140.

The second conductive layer is disposed on the first protective layer 140. The second conductive layer may include a first source/drain electrode 330 and a second source/drain electrode 340 of the driving transistor DT, a first conductive pattern 370, and a second conductive pattern 710.

The second conductive pattern 710 may be disposed on the first protective layer 140 such that at least portion thereof overlaps with the first gate electrode 310. The first capacitor Cst may be formed between the first gate electrode 310 and the second conductive pattern 710. In other words, the second conductive pattern 710 may be the capacitor electrode of the first capacitor Cst.

The first source/drain electrode 330 of the driving transistor DT may be connected to (e.g., may be in contact with) the first active layer 350 through the first contact hole CT1 that partially exposes an upper surface of the first conductive region 350a of the first active layer 350. The second source/drain electrode 340 of the driving transistor DT may be connected to (e.g., may be in contact with) the first active layer 350 through the first contact hole CT1 that partially exposes an upper surface of the second conductive region 350b of the first active layer 350. The first source/drain electrode 330 of the driving transistor DT may be electrically connected to a first voltage line 810 (e.g., VDDL) through a third conductive pattern 610 that will be described in more detail below. The second source/drain electrode 340 of the driving transistor DT may be electrically connected to a first electrode AE of the light-emitting element EL through a fifth conductive pattern 650 and a sixth conductive pattern 850, which will be described in more detail below.

The first conductive pattern 370 is disposed so as to overlap with the first gate electrode 310 of the driving transistor DT with the first gate insulating layer 130 interposed therebetween. The first conductive pattern 370 may be connected to (e.g., may be in contact with) the first gate electrode 310 through the first contact hole CT1 that partially exposes an upper surface of the first gate electrode 310. The first conductive pattern 370 may be connected to (e.g., may be in contact with) a first source/drain electrode 430 of the first switching transistor ST1, which will be described in more detail below.

The second conductive layer may include (e.g., may be formed as) a single layer structure or a multi-layered structure including (e.g., made of) at least one selected from among Mo, Al, Cr, Au, Ti, Ni, Nd, and Cu, or an alloy thereof. However, the present disclosure is not limited thereto.

The first interlayer insulating layer 150 is disposed on the second conductive layer. In more detail, the first interlayer insulating layer 150 may be formed so as to cover an entire surface of the first protective layer 140 and the second conductive pattern 710. Second contact holes CT2, which extend (e.g., pass) through the first interlayer insulating layer 150 to partially expose the second conductive layer, may be formed in the first interlayer insulating layer 150. For example, the second contact holes CT2 may partially expose an upper surface of each of the first source/drain electrode 330 of the driving transistor DT, the second source/drain electrode 340 of the driving transistor DT, the first conductive pattern 370, and the second conductive pattern 710. In addition, the second contact holes CT2 may be formed so as to extend (e.g., pass) through the second buffer layer 122 and the second gate insulating layer 160, which will be described in more detail below. Furthermore, the third conductive layer, which will be described in more detail below, may be connected to (e.g., may be in contact with) the second conductive layer, for example, the first source/drain electrode 330 and the second source/drain electrode 340 of the driving transistor DT, the first conductive pattern 370, and the second conductive pattern 710, through the second contact holes CT2.

The first interlayer insulating layer 150 may include (e.g., may be made of) an inorganic material, for example, such as SiOx, SiNx, or a stacked structure thereof.

The second buffer layer 122 is disposed on the first interlayer insulating layer 150. The display device 1 includes the driving transistor DT and the first switching transistor ST1 that are disposed at (e.g., in or on) different layers from each other, so that the display device 1 may include at least one buffer layer on which each of the driving transistor DT and the first switching transistor ST1 is disposed. The display device 1 according to an exemplary embodiment includes the first buffer layer 121, and the second buffer layer 122 that is disposed above the first buffer layer 121. The first active layer 350 of the driving transistor DT may be disposed on the first buffer layer 121 disposed on the first substrate 110, and the second active layer 450 of the first switching transistor ST1 may be disposed on the second buffer layer 122. The second buffer layer 122 may be disposed on an entire upper surface of the first interlayer insulating layer 150. A structure, material, and/or function of the second buffer layer 122 may be the same or substantially the same as those of the first buffer layer 121, and thus, detailed description thereof may not be repeated.

The second semiconductor layer is disposed on the second buffer layer 122. The second semiconductor layer includes the second active layer 450 of the first switching transistor ST1. The second active layer 450 may include (e.g., may be made of) polycrystalline silicon, single-crystal silicon, low-temperature polycrystalline silicon, amorphous silicon, or an oxide semiconductor.

The second active layer 450 may include a third conductive region 450a, a fourth conductive region 450b, and a channel region 450c. The channel region 450c may be disposed between the third conductive region 450a and the fourth conductive region 450b. The third conductive region 450a and the fourth conductive region 450b may be connected to (e.g., may be in contact with) the first source/drain electrode 430 and a second source/drain electrode 440 of the first switching transistor ST1, respectively, which will be described in more detail below.

The second gate insulating layer 160 may be disposed on the second semiconductor layer. The second gate insulating layer 160 may be disposed on the second buffer layer 122 and at least the second active layer 450. In more detail, the second gate insulating layer 160 may be disposed on a portion of the second buffer layer 122 on which the second active layer 450 is not disposed, and on a region in which the second gate insulating layer 160 overlaps with the channel region 450c of the second active layer 450. In FIG. 5, the second gate insulating layer 160 is illustrated as being disposed to cover an entirety of the second buffer layer 122 including an upper surface and side surfaces of the second active layer 450, but the present disclosure is not limited thereto. For example, the second gate insulating layer 160 may be disposed only on the upper surface of the second active layer 450, and thus, may be disposed only between the second gate electrode 410 and the second active layer 450, which will be described in more below.

The second gate insulating layer 160 may include (e.g., may be made of) an inorganic material, for example, such as SiOx, SiNx, or a stacked structure thereof. Similar to the first gate insulating layer 130, the material, thickness, and/or the like of the second gate insulating layer 160 may be variously modified (e.g., variously selected) to secure or improve device characteristics of the first switching transistor ST1. In the display device 1 according to an exemplary embodiment, the first gate insulating layer 130 and the second gate insulating layer 160 may have different physical properties from each other to secure or improve device characteristics desired for different transistors, for example, the driving transistor DT and the first switching transistor ST1.

In the case of the display device 1 having a high resolution, the width of the channel region of the active layer of each of the transistors of each pixel PX may be shortened, such that a larger number of pixels PX may be disposed per unit area. As described above, in the display device 1, because the driving transistor DT and the first switching transistor ST1 are disposed at (e.g., in or on) different layers from each other, the first active layer 350 and the second active layer 450 may be disposed at (e.g., in or on) different layers from each other, and thus, may be formed to have different structures from each other. For example, the channel region of the driving transistor DT may have a relatively greater width than that of the first switching transistor ST1 to secure a wide range of driving voltages.

According to an exemplary embodiment, the width of the channel region 350c of the first active layer 350 of the driving transistor DT, which is measured in one direction (e.g., the X-axis direction), may be greater than the width of the channel region 450c of the second active layer 450 of the first switching transistor ST1, which is measured in the one direction. In the display device 1, because the driving transistor DT and the first switching transistor ST1 are disposed at (e.g., in or on) different layers from each other, the driving transistor DT may have a wide channel region to secure excellent device characteristics, and the first switching transistor ST1 may have a relatively narrow channel region, thereby implementing the display device 1 having a high resolution. For example, the channel region 350c of the first active layer 350 may have a width of about 15 μm or more, and the channel region 450c of the second active layer 450 may have a width of about 4.5 μm or more. However, the present disclosure is not limited thereto.

According to an exemplary embodiment, device characteristics desired for the driving transistor DT and the first switching transistor ST1 may be controlled according to the characteristics of the gate insulating layer disposed between the active layer and the gate electrode of each of the driving transistor DT and the first switching transistor ST1. For example, because the first gate insulating layer 130 of the driving transistor DT and the second gate insulating layer 160 of the first switching transistor ST1 are disposed at (e.g., in or on) different layers from each other, the first gate insulating layer 130 and the second gate insulating layer 160 may be formed through different processes. By forming the first gate insulating layer 130 and the second gate insulating layer 160 differently from each other, device characteristics desired for the driving transistor DT and the first switching transistor ST1 may be improved.

According to an exemplary embodiment, in the display device 1, the first gate insulating layer 130 and the second gate insulating layer 160 may include different insulating materials from each other. For example, the first gate insulating layer 130 may have a low dielectric constant to secure or improve a wide range of drive voltages in the driving transistor DT, and the second gate insulating layer 160 may have a high dielectric constant to suppress or reduce a deterioration in the device characteristics of the first switching transistor ST1, which may occur due to the first switching transistor ST1 having a short channel region.

In one or more exemplary embodiments, the first gate insulating layer 130 may include SiOx, and the second gate insulating layer 160 may include a first insulating layer 161 including SiOx, and a second insulating layer 163 disposed on the first insulating layer 161 and including SiNx or SiON. For example, the first gate insulating layer 130 may be formed as a single layer including SiOx, and the second gate insulating layer 160 may be formed as multiple layers including the first insulating layer 161 of SiOx, and the second insulating layer 163 of SiNx or SiON.

SiNx and/or SiON may have a higher dielectric constant than that of SiOx. In this case, the second gate insulating layer 160, which is disposed on the second active layer 450 of the first switching transistor ST1, may include the second insulating layer 163 of SiNx or SiON, and thus, may have a higher dielectric constant than that of the first gate insulating layer 130. Thus, even when the first switching transistor ST1 has a short channel region, the deterioration in the device characteristics thereof may be suppressed or reduced.

Figure 6:
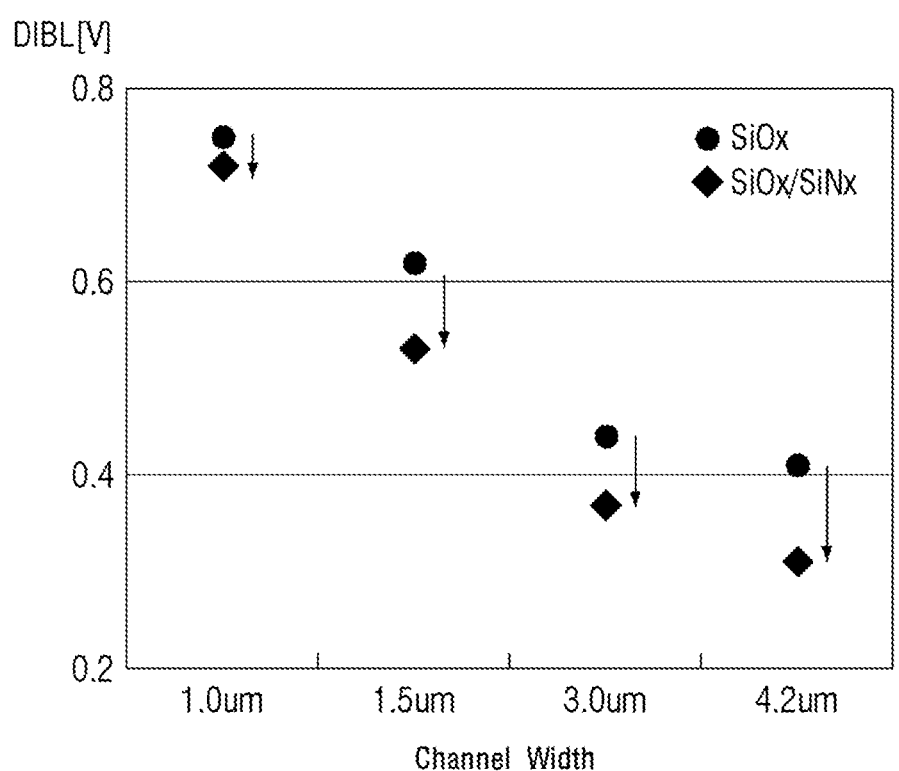
FIG. 6 is a graph illustrating a change in a drain-induced barrier lowering value according to the width of a channel region of a transistor and a type of a gate insulating layer.

FIG. 6 is a graph illustrating a change in a drain-induced barrier lowering (DIBL) value according to the width of a channel region of a transistor and a type of a gate insulating layer.

FIG. 6 illustrates a change in the DIBL value according to the width of the channel region for a PMOS transistor that includes a gate insulating layer formed as a single layer of SiOx, and a PMOS transistor that includes a gate insulating layer formed as a multi-layer of SiOx/SiNx. Referring to FIG. 6, in the transistor, as the width of the channel region is shortened, the DIBL value increases. The increase in the DIBL value may adversely affect the device characteristics desired for the first switching transistor ST1.

As illustrated in FIG. 6, the DIBL value in the case in which the gate insulating layer is formed as a multi-layer, for example, a multi-layer of SiOx/SiNx, is lower than that of the case in which the gate insulating layer is formed as a single layer of SiOx. In other words, in the display device 1 having a high resolution, because the second gate insulating layer 160 includes the second insulating layer 163 made of SiNx that has a high dielectric constant, the increase in the DIBL value may be suppressed or reduced even when the first switching transistor ST1 has a short channel region. Accordingly, in the display device 1, the driving transistor DT may have a wide range of driving voltages as the driving transistor DT has a wide channel region, and deterioration in the device characteristics of the first switching transistor ST1 may be suppressed or reduced by including the second gate insulating layer 160 having a high dielectric constant.

In FIG. 5, the second gate insulating layer 160 is illustrated as being formed as a double layer of SiOx/SiNx, but the present disclosure is not limited thereto. In some exemplary embodiments, the first gate insulating layer 130 may also be formed as a multi-layer, the second insulating layer 163 of the second gate insulating layer 160 may include other materials, and the first gate insulating layer 130 and the second gate insulating layer 160 may be formed to have different thicknesses from each other. This will be described in more detail below with reference to one or more other exemplary embodiments.

However, even when the first gate insulating layer 130 and the second gate insulating layer 160 are formed as a single layer or multiple layers by including different insulating materials from each other, an insulating layer including (e.g., made of) SiOx may be disposed on the first active layer 350 and/or the second active layer 450. In other words, in some exemplary embodiments, the first insulating layer 161 of the second gate insulating layer 160 may be in contact (e.g., in direct contact) with the second active layer 450. In order to secure or improve stable device characteristics of the driving transistor DT and/or the first switching transistor ST1, a gate insulating layer or an insulating layer of SiOx may be disposed on the active layers 350 and 450. Further, in some exemplary embodiments, the first insulating layer 161 of SiOx may have a greater thickness than that of the second insulating layer 163 of SiNx. However, the present disclosure is not limited thereto.

Referring again to FIG. 5, the third conductive layer is disposed on the second gate insulating layer 160. The third conductive layer may include the third conductive pattern 610, a fourth conductive pattern 630, the fifth conductive pattern 650, the second gate electrode 410 of the first switching transistor ST1, and the first source/drain electrode 430 of the first switching transistor ST1.

The second gate electrode 410 of the first switching transistor ST1 may overlap with at least a portion of the second active layer 450 with the second gate insulating layer 160 interposed therebetween. For example, as illustrated in FIG. 5, the width of the second gate electrode 410, which is measured in one direction (e.g., the X-axis direction), may be smaller than the width of the second active layer 450, which is measured in the one direction. The second gate electrode 410 may be disposed to overlap with at least the channel region 450c of the second active layer 450, and the width of the second gate electrode 410, which is measured in the one direction, may be equal to or substantially equal to the width of the channel region 450c of the second active layer 450, which is measured in the one direction.

The first source/drain electrode 430 of the first switching transistor ST1 may be connected to (e.g., may be in contact with) the second active layer 450 through a contact hole that partially exposes an upper surface of the third conductive region 450a of the second active layer 450. In addition, the first source/drain electrode 430 of the first switching transistor ST1 may be connected to (e.g., may be in contact with) the first conductive pattern 370 through the second contact hole CT2 that partially exposes the upper surface of the first conductive pattern 370. The first source/drain electrode 430 of the first switching transistor ST1 may be connected to the first gate electrode 310 of the driving transistor DT.

Each of the third conductive pattern 610, the fourth conductive pattern 630, and the fifth conductive pattern 650 may be connected to (e.g., may be in contact with) the second conductive layer exposed through the second contact holes CT2. For example, the third conductive pattern 610 may be connected to (e.g., may be in contact with) the first source/drain electrode 330 of the driving transistor DT exposed through the second contact hole CT2, and the fifth conductive pattern 650 may be connected to (e.g., may be in contact with) the second source/drain electrode 340 of the driving transistor DT exposed through the second contact hole CT2. In addition, the fourth conductive pattern 630 may be connected to (e.g., may be in contact with) the second conductive pattern 710 exposed through the second contact hole CT2. The third conductive pattern 610 may be connected to (e.g., may be in contact with) a first voltage line 810, and the first source/drain electrode 330 of the driving transistor DT may be electrically connected to the first voltage line 810 (e.g., VDDL). The fourth conductive pattern 630 may be connected to (e.g., may be in contact with) an initialization voltage line 830, and the second conductive pattern 710 may be electrically connected to the initialization voltage line 830. The fifth conductive pattern 650 may be connected to (e.g., may be in contact with) the sixth conductive pattern 850, and the second source/drain electrode 340 of the driving transistor DT may be electrically connected to the first electrode AE of the light-emitting element EL through the sixth conductive pattern 850.

The third conductive layer may be formed as a single layer or a multi-layer that includes (e.g., is made of) at least one selected from among Mo, Al, Cr, Au, Ti, Ni, Nd, and Cu, or an alloy thereof. However, the present disclosure is not limited thereto.

The second interlayer insulating layer 170 is disposed on the third conductive layer. In more detail, the second interlayer insulating layer 170 may be formed to cover an entire surface of the second gate insulating layer 160 and the third conductive layer. Third contact holes CT3, which extend (e.g., pass) through the second interlayer insulating layer 170 to partially expose the third conductive layer, may be formed in the second interlayer insulating layer 170. For example, the third contact holes CT3 may partially expose an upper surface of each of the third conductive pattern 610, the fourth conductive pattern 630, and the fifth conductive pattern 650. In addition, some of the third contact holes CT3 may be formed to extend (e.g., pass) through the second gate insulating layer 160 to partially expose the upper surface of the second active layer 450 of the first switching transistor ST1. The fifth conductive layer, which will be described in more detail below, may be connected to (e.g., may be in contact with) the third conductive layer or the second active layer 450 through the third contact holes CT3.

The second interlayer insulating layer 170 may include (e.g., may be made of) an inorganic material, for example, such as SiOx, SiNx, or a stacked structure thereof.

The fourth conductive layer is disposed on the second interlayer insulating layer 170. The fourth conductive layer may include a data signal line 720 through which data signals DL are transmitted. The data signal line 720 may overlap with the sixth conductive pattern 850 with the second protective layer 180 interposed therebetween. The second capacitor Cpr may be formed at (e.g., in or on) a region in which the sixth conductive pattern 850 and the data signal line 720 overlap with each other, and the sixth conductive pattern 850 may be a capacitor electrode of the second capacitor Cpr. The fourth conductive layer may be formed as a single layer or a multi-layer that includes (e.g., that is made of) at least one selected from among Mo, Al, Cr, Au, Ti, Ni, Nd, and Cu, or an alloy thereof. However, the present disclosure is not limited thereto.

The second protective layer 180 is disposed on the fourth conductive layer and the second interlayer insulating layer 170. The second protective layer 180 may be disposed on an entire surface of the second interlayer insulating layer 170 and the data signal line 720. A structure, material, and/or function of the second protective layer 180 may be the same or substantially the same as those of the first protective layer 140, and thus, redundant description thereof may not be repeated.

The fifth conductive layer is disposed on the second protective layer 180. The fifth conductive layer may include the first voltage line 810, the initialization voltage line 830, and the sixth conductive pattern 850.

The first voltage line 810 may be connected to (e.g., may be in contact with) the third conductive pattern 610 exposed through the third contact hole CT3. The first source/drain electrode 330 of the driving transistor DT may be electrically connected to the first voltage line 810 through the third conductive pattern 610, and the driving transistor DT may be connected to the first voltage line 810 (e.g., VDDL).

The initialization voltage line 830 may be connected to (e.g., may be in contact with) the fourth conductive pattern 630 exposed through the third contact hole CT3. The second conductive pattern 710 may be electrically connected to the initialization voltage line 830 through the fourth conductive pattern 630.

The sixth conductive pattern 850 may be disposed such that at least a portion thereof overlaps with the data signal line 720. As described above, the second capacitor Cpr may be formed at (e.g., in or on) the region in which the sixth conductive pattern 850 and the data signal line 720 overlap with each other, and a portion (e.g., a region) of the sixth conductive pattern 850 that overlaps with the data signal line 720 may form the capacitor electrode of the second capacitor Cpr.

In addition, the sixth conductive pattern 850 may be connected to (e.g., may be in contact with) the fifth conductive pattern 650 through the third contact hole CT3 that partially exposes the upper surface of the fifth conductive pattern 650. As will be described in more detail below, the fifth conductive pattern 650 may be connected to (e.g., may be in contact with) the first electrode AE of the light-emitting element EL, and the second source/drain electrode 340 of the driving transistor DT may be connected to the first electrode AE of the light-emitting element EL through the fifth conductive pattern 650 and the sixth conductive pattern 850.

At least a portion of the sixth conductive pattern 850 may be connected to (e.g., may be in contact with) the second active layer 450 through the third contact hole CT3 that extends (e.g., that passes) through the second interlayer insulating layer 170 and the second gate insulating layer 160 to partially expose the upper surface of the second active layer 450. For example, at least a portion of the sixth conductive pattern 850 may be connected to (e.g., may be in contact with) the fourth conductive region 450b of the second active layer 450, and the portion of the sixth conductive pattern 850 may form the second source/drain electrode 440 of the first switching transistor ST1.

The fifth conductive layer may be formed as a single layer or a multi-layer that includes (e.g., that is made of) at least one selected from among Mo, Al, Cr, Au, Ti, Ni, Nd, and Cu, or an alloy thereof. However, the present disclosure is not limited thereto.

The first planarizing film 190 is disposed on the fifth conductive layer and the second protective layer 180. The first planarizing film 190 may planarize a stepped portion caused by the thin-film transistors, for example, such as the driving transistor DT and the first switching transistor ST1. The first planarizing film 190 may be formed of an organic film including (e.g., made of) an acryl resin, an epoxy resin, a phenolic resin, a polyamide resin, a polyimide resin, and/or the like.

While in FIG. 5, the first planarizing film 190 is illustrated as being directly disposed on the fifth conductive layer, the present disclosure is not limited thereto. For example, in some embodiments, another protective layer may be further disposed between the first planarizing film 190 and the second protective layer 180, and between the first planarizing film and the fifth conductive layer.

A pixel definition film 195 and the light-emitting element EL, which includes the first electrode AE, the organic light-emitting layer OL, and a second electrode CE, may be formed on the first planarizing film 190.

The first electrode AE may be formed on the first planarizing film 190. The first electrode AE may be a pixel electrode that is formed for every pixel (e.g., for each pixel) PX. The first electrode AE may be connected to (e.g., may be in contact with) the sixth conductive pattern 850 exposed through an electrode contact hole CNTD that extends (e.g., that passes) through the first planarizing film 190, and thus, the first electrode AE may be connected to the second source/drain electrode 440 of the first switching transistor ST1 and the second source/drain electrode 340 of the driving transistor DT.

In order to partition the pixels PX, the pixel definition film 195 may be formed on the first planarizing film 190 to cover an edge of the first electrode AE. In other words, the pixel definition film 195 may act as (e.g., may be) a pixel definition film that defines the pixels PX. Here, each of the pixels PX represents a region at (e.g., in or on) which the first electrode AE, the organic light-emitting layer OL, and the second electrode CE are sequentially stacked, so that holes from the first electrode AE and electrons from the second electrode CE are combined with each other in the organic light-emitting layer OL to emit light.

The organic light-emitting layer OL may be disposed on the first electrode AE and the pixel definition film 195. The organic light-emitting layer OL may include a hole transporting layer, a light-emitting layer, and an electron transporting layer. Further, the organic light-emitting layer OL may be formed in a tandem structure of two or more stacks, and in this case, a charge generation layer may be formed between the stacks. In FIG. 5, the organic light-emitting layer OL is illustrated as being formed at (e.g., in or on) a portion corresponding to the first electrode AE, but the present disclosure is not limited thereto. In some exemplary embodiments, the organic light-emitting layer OL may be formed over an entire surface of the display area DA.

The second electrode CE may be formed on the organic light-emitting layer OL. The second electrode CE may be a common electrode that is commonly formed in the pixels PX.

The light-emitting elements EL may be formed as top emission light-emitting elements, in which light is emitted in an upward direction. In this case, the first electrode AE may include (e.g., may be made of) a conductive (e.g., a metallic) material that has high reflectivity, and may have, for example, a stacked structure (Ti/Al/Ti) of aluminum and titanium, a stacked structure (ITO/Al/ITO) of aluminum and indium tin oxide (ITO), a silver-palladium-copper (APC) alloy, and/or a stacked structure (ITO/APC/ITO) of an APC alloy and ITO. The APC alloy may be an alloy including silver (Ag), palladium (Pd), and Cu. In addition, the second electrode CE may include (e.g., may be made of) a transparent conductive (e.g., metallic) material (TCO) that is capable of transmitting light, for example, such as ITO or indium zinc oxide (IZO), or may include (e.g., may be made of) a semi-transmissive conductive (e.g., metallic) material, for example, such as magnesium (Mg), Ag, or an alloy of Mg and Ag. When the second electrode CE includes (e.g., is made of) the semi-transmissive conductive (e.g., metallic) material, light extraction efficiency may be improved due to a microcavity.

An encapsulation layer TFE configured to prevent or substantially prevent oxygen or moisture from penetrating therethrough may be formed on the second electrode CE. The encapsulation layer TFE may include at least one inorganic film. The inorganic film may include (e.g., may be made of) silicon nitride, aluminum nitride, zirconium nitride, titanium nitride, hafnium nitride, tantalum nitride, silicon oxide, aluminum oxide, and/or titanium oxide. In addition, the encapsulation layer TFE may include at least one organic film to prevent or substantially prevent particles from penetrating the encapsulation layer TFE and/or from being introduced into the organic light-emitting layer OL and the second electrode CE. The organic film may include (e.g., may be formed of) an epoxy, an acrylate, or a urethane acrylate.

In the display device 1 according to an exemplary embodiment, the driving transistor DT and the first switching transistor ST1 may be disposed at (e.g., in or on) different layers from each other, and the active layers of the driving transistor DT and the first switching transistor ST1 may have different widths from each other. The driving transistor DT may have a long channel region to secure a wide range of driving voltages thereof. In addition, the first gate insulating layer 130 and the second gate insulating layer 160 may be formed in different processes form each other, and thus, the characteristics of the first gate insulating layer 130 and the second gate insulating layer 160 may be controlled. Accordingly, even when the first switching transistor ST1 has a relatively short channel region, because the second gate insulating layer 160 has a high dielectric constant, a deterioration in device characteristics may be suppressed or reduced. The display device 1 according to an exemplary embodiment may have high-resolution display quality by including a large number of pixels PX.

Hereinafter, various exemplary embodiments of the display device 1 will be described with reference to the other figures.

Figure 7:
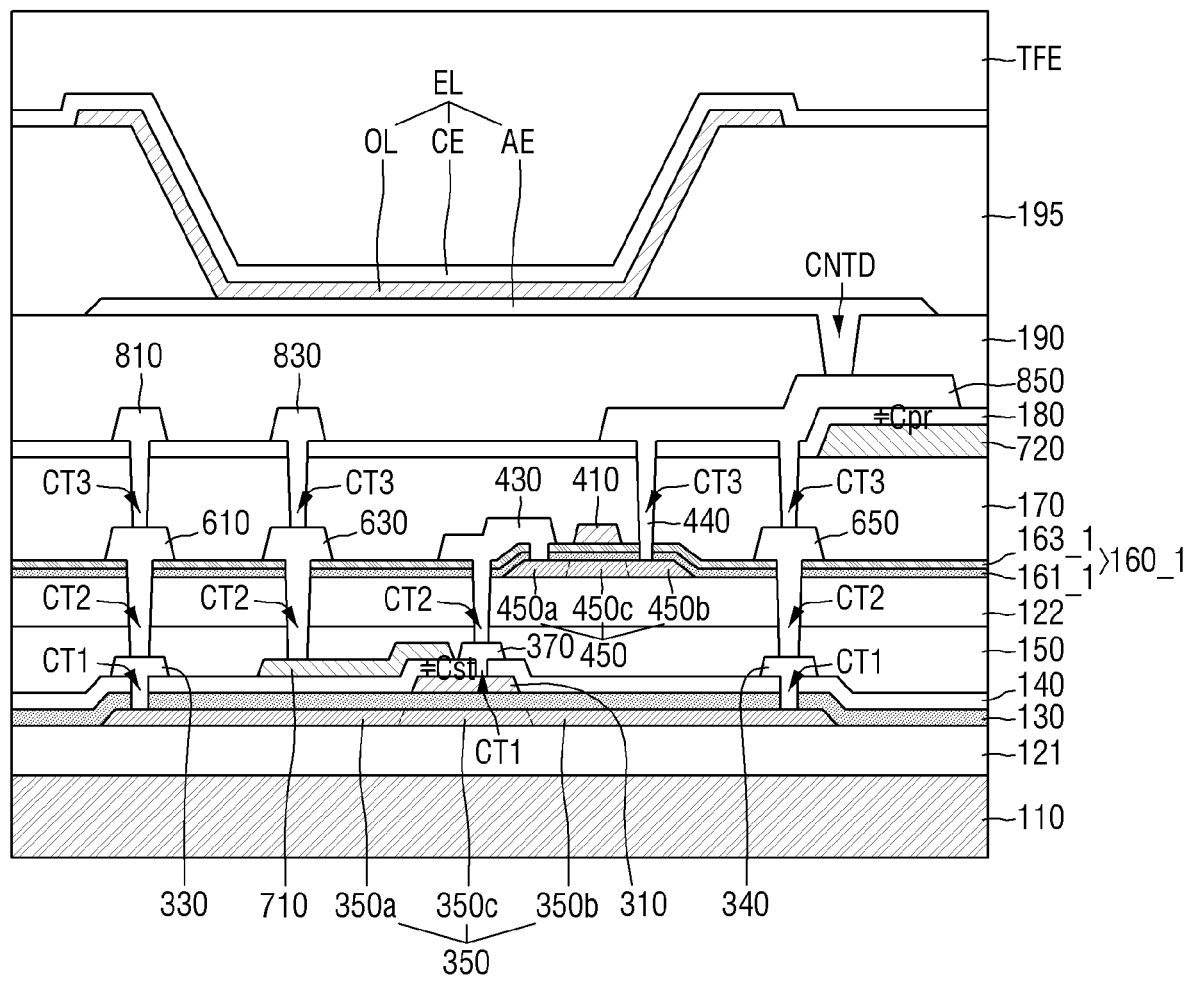
FIGS. 7-9 are cross-sectional views illustrating portions of display devices according to various exemplary embodiments.
Figure 8:
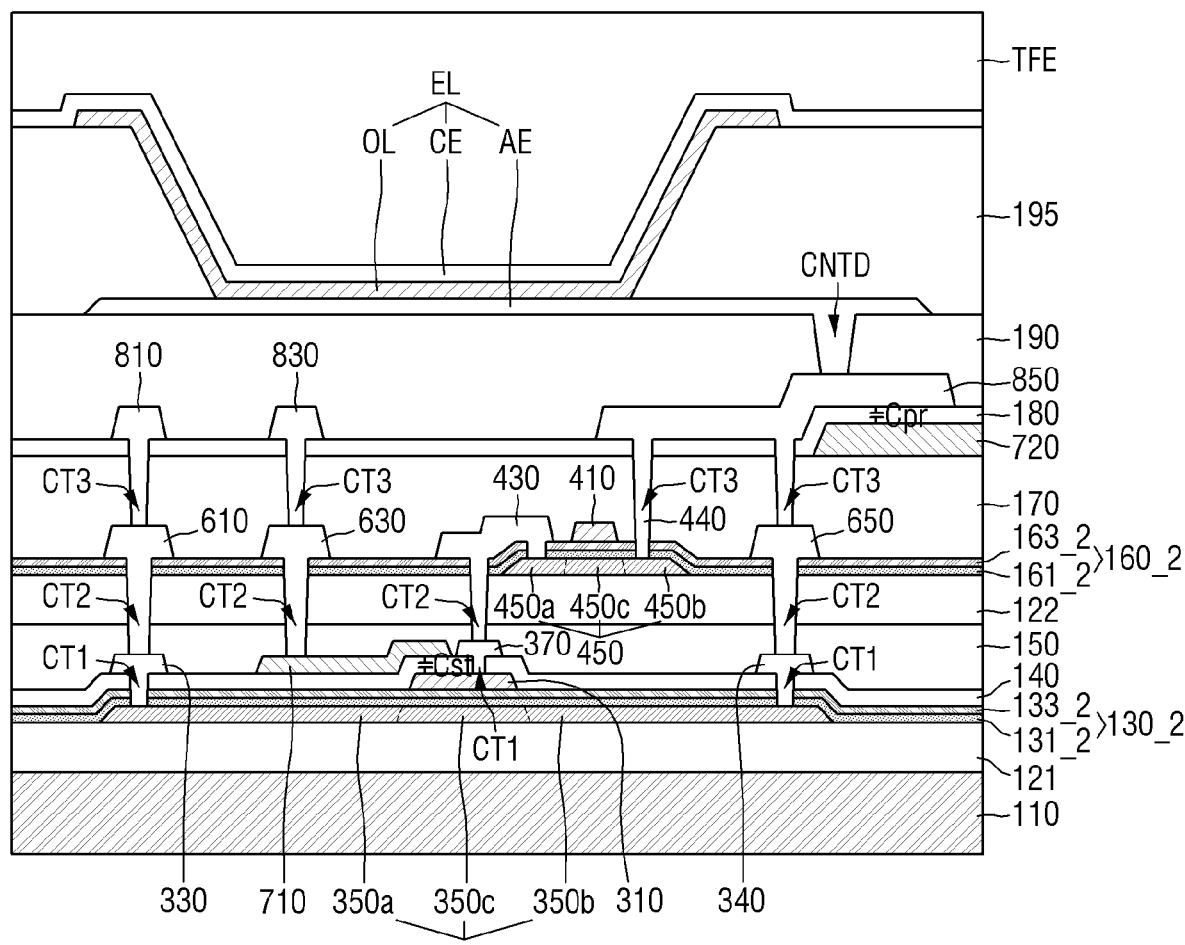
Figure 9:
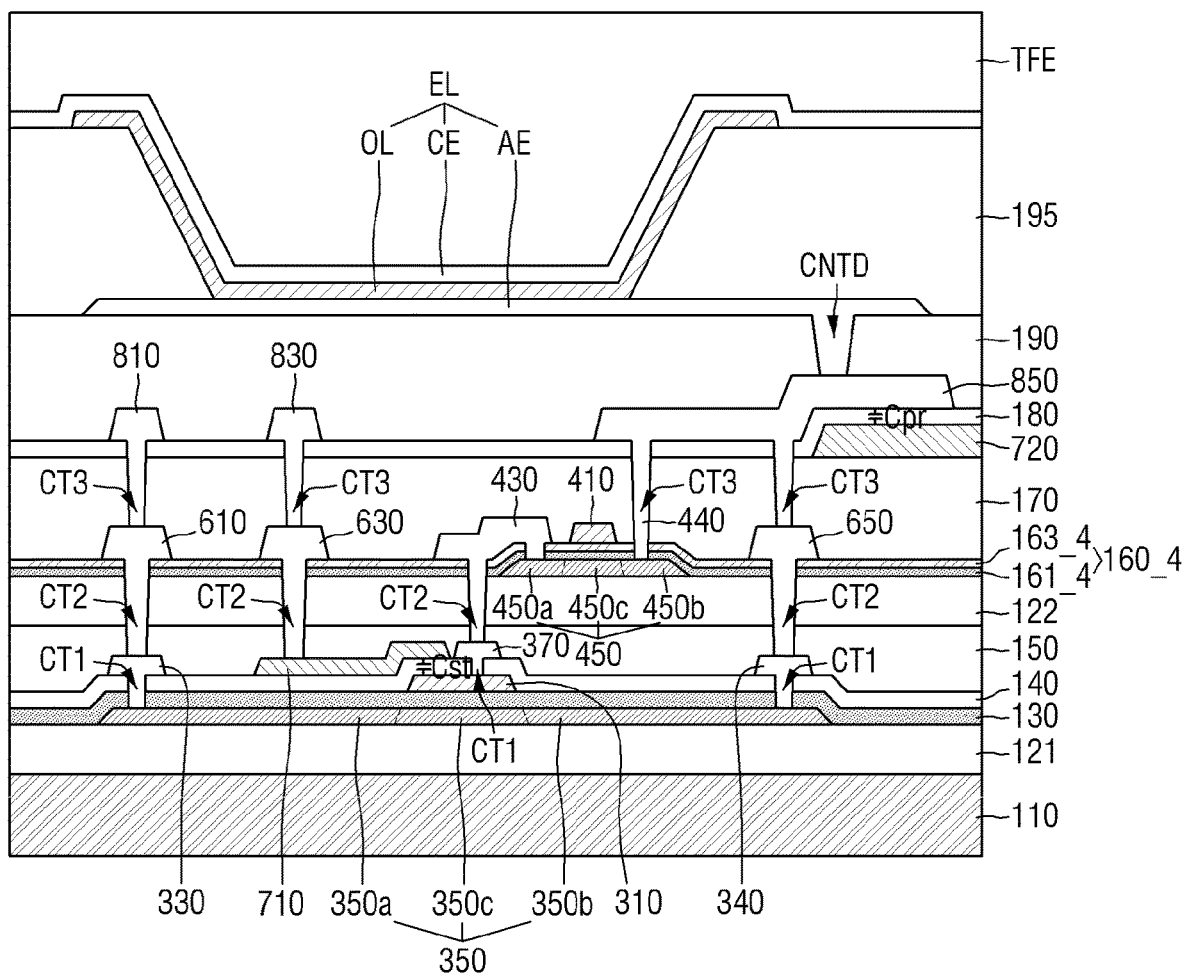

FIGS. 7 to 9 are cross-sectional views illustrating portions of display devices according to various exemplary embodiments.

Referring to FIG. 7, in a display device 1 according to an exemplary embodiment, a second insulating layer 163_1 of a second gate insulating layer 160_1 may include SiNx having a low hydrogen (H) content. The present exemplary embodiment may be different from the exemplary embodiment described with reference to FIG. 5 in that the materials of the second gate insulating layer 160_1 and the second insulating layer 163_1 may be different from those of FIG. 5. Hereinafter, the differences from one or more of the above-described embodiments may be mainly described in more detail, and redundant description thereof may not be repeated.

During the process of forming the second insulating layer 163_1 including (e.g., made of) SiNx, a hydrogen (H) content in the SiNx may be controlled by adjusting a flow rate of ammonia ($NH_3$), which may be a precursor including (e.g., made of) nitrogen (N). When the second insulating layer 163_1 of the second gate insulating layer 160_1 includes SiNx with low hydrogen content, an increase in the DIBL value that may occur as the channel region is shortened may be further suppressed or reduced. In other words, when the second insulating layer 163_1 of the second gate insulating layer 160_1 includes SiNx with low hydrogen content, the device characteristics of the first switching transistor ST1 may be further improved.

As described above, the first gate insulating layer 130 may also be formed as multiple layers that include different insulating materials.

Referring to FIG. 8, in a display device 1 according to another exemplary embodiment, a first gate insulating layer 130_2 may include a third insulating layer 131_2 including (e.g., made of) SiOx, and a fourth insulating layer 133_2 disposed on the third insulating layer 131_2 and including (e.g., made of) SiNx. The present exemplary embodiment is different from the exemplary embodiment described with reference to FIG. 5 in that the first gate insulating layer 130_2 is formed as multiple layers. Hereinafter, the differences from one or more of the above-described embodiments may be mainly described in more detail, and redundant description thereof may not be repeated.

In the display device 1 of FIG. 8, the device characteristics of the first switching transistor ST1 may be secured or improved as a second gate insulating layer 160_2 may include a first insulating layer 161_2 and a second insulating layer 163_2. Further, the device characteristics of the driving transistor DT may be improved as the first gate insulating layer 130_2 may include the third insulating layer 131_2 and the fourth insulating layer 133_2.

Unlike the first switching transistor ST1, the driving transistor DT may have a wide channel region so that a sufficient range of driving voltages may be secured in the driving transistor DT. Here, when a dielectric constant of the first gate insulating layer 130_2 increases as the first gate insulating layer 130_2 includes the fourth insulating layer 133_2 including (e.g., made of) silicon nitride, hysteresis may decrease in the driving transistor DT. As the dielectric constant of the first gate insulating layer 130_2 increases, the hysteresis of the driving transistor DT may decrease even when the driving transistor DT is repeatedly turned on and off.

However, as described above, even when the first gate insulating layer 130_2 is formed as multiple layers, the third insulating layer 131_2 including (e.g., made of) SiOx may be disposed on the first active layer 350. In other words, according to another exemplary embodiment, the third insulating layer 131_2 of the first gate insulating layer 130_2 may be in contact (e.g., in direct contact) with the first active layer 350.

Further, when the first gate insulating layer 130_2 and the second gate insulating layer 160_2 include the fourth insulating layer 133_2 and the second insulating layer 163_2 that are made of SiNx, respectively, the fourth insulating layer 133_2 and the second insulating layer 163_2 may have different physical properties from each other according to the device characteristics desired for the driving transistor DT and the first switching transistor ST1, respectively. In an exemplary embodiment, the fourth insulating layer 133_2 of the first gate insulating layer 130_2 may have a hydrogen content that is lower than that of the second insulating layer 163_2 of the second gate insulating layer 160_2. In other words, the fourth insulating layer 133_2 of the first gate insulating layer 130_2 may include (e.g., may be made of) SiNx with low hydrogen content. However, the present disclosure is not limited thereto.

As described above, the second insulating layer 163 of the second gate insulating layer 160 may include SiON. In this case, in the first switching transistor ST1, a threshold voltage Vth may be shifted, and the device characteristics thereof as a switching transistor may be further improved.

Referring to FIG. 9, in a display device 1 according to another exemplary embodiment, a second gate insulating layer 160_4 may include a first insulating layer 161_4 including (e.g., made of) SiOx, and a second insulating layer 163_4 including (e.g., made of) SiON. The present exemplary embodiment may be different from the exemplary embodiment described with reference to FIG. 5 in that the second insulating layer 163_4 may include (e.g., may be made of) SiON.

When the second gate insulating layer 160_4 includes the first insulating layer 161_4 including (e.g., made of) SiOx and the second insulating layer 163_4 including (e.g., made of) SiON, like in the display device 1 of FIG. 9, a threshold voltage Vth of a PMOS transistor may be further lowered.

Figure 10:
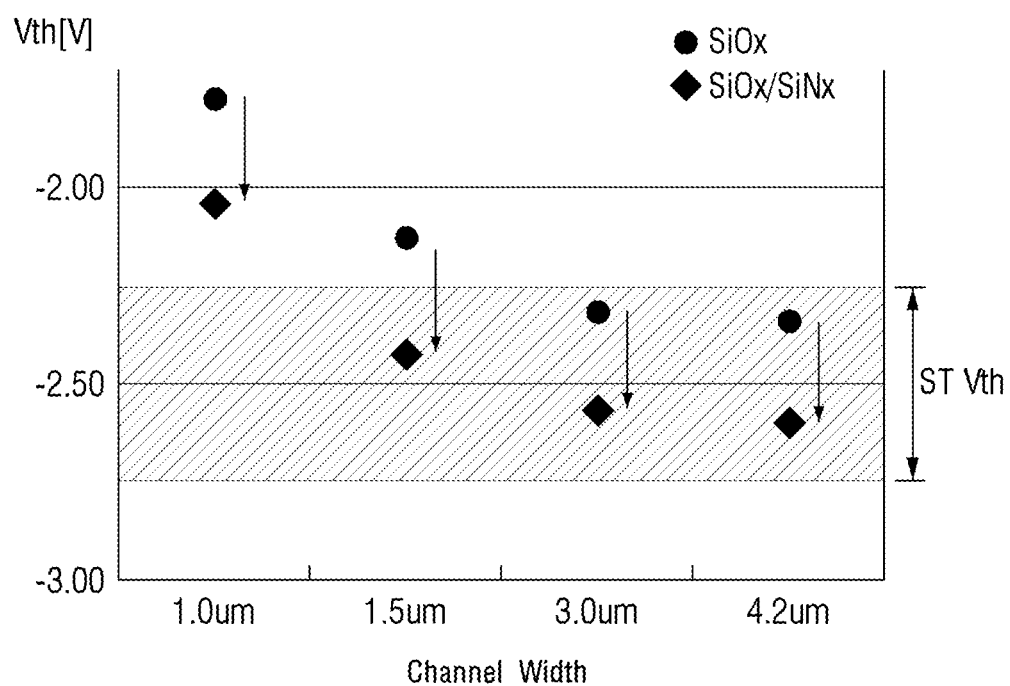
FIG. 10 is a graph illustrating a change in a threshold voltage value according to the width of a channel region of a transistor and a type of a gate insulating layer.

FIG. 10 is a graph illustrating a change in a threshold voltage Vth value according to the width of a channel region of a transistor and the type of a gate insulating layer.

FIG. 10 illustrates the change in the threshold voltage Vth according to the widths of the channel regions of a PMOS transistor that includes a gate insulating layer formed as a single layer of SiOx, and a PMOS transistor that includes a gate insulating layer formed as a multi-layer of SiOx/SiON. In FIG. 10, a region represented by 'ST Vth' indicates a range of threshold voltages Vth desired for the first switching transistor ST1 of the display device 1. Referring to FIG. 10, in the case of the PMOS transistor, the absolute value of the threshold voltage Vth decreases as the width of the channel region decreases. In some cases, the first switching transistor ST1 may have a threshold voltage Vth value that is outside the range of the threshold voltages Vth desired for the first switching transistor ST1.

On the other hand, in the case in which the gate insulating layer is formed as a multi-layer of SiOx/SiON, the absolute value of the threshold voltage Vth of the PMOS transistor may become greater than that of the case in which the gate insulating layer is formed as a single layer of SiOx. In other words, in the display device 1 having a high resolution, as the second gate insulating layer 160_4 includes the second insulating layer 163_4 including (e.g., made of) SiON, a threshold voltage Vth may be suppressed from being outside of the ranges desired for the switching transistor, even when the first switching transistor ST1 has a short width channel region. Accordingly, because the display device 1 includes the second gate insulating layer 160_4 including SiON, the device characteristics of the first switching transistor ST1 may be suppressed or substantially suppressed from being decreased.

Figure 11:
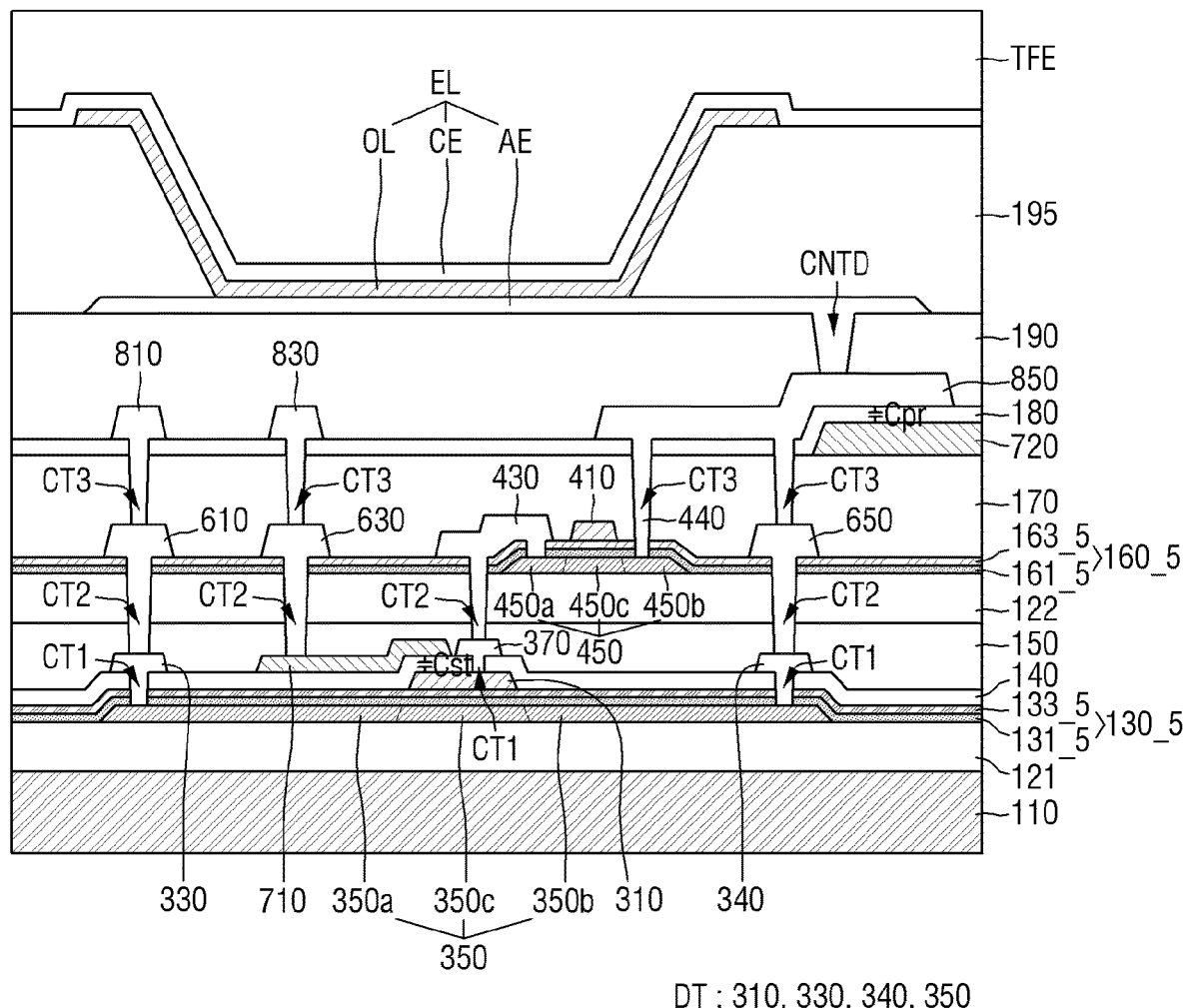
FIGS. 11-13 are cross-sectional views illustrating portions of display devices according to various exemplary embodiments.

FIG. 11 is a cross-sectional view illustrating a portion of a display device according to another exemplary embodiment.

Referring to FIG. 11, in a display device 1 according to another exemplary embodiment, a second gate insulating layer 160_5 may include a first insulating layer 161_5 including (e.g., made of) SiON, and a second insulating layer 163_5 including (e.g., made of) SiOX. A first gate insulating layer 130_5 may include a third insulating layer 131_5 including (e.g., made of) SiOx, and a fourth insulating layer 133_5 including (e.g., made of) SiNx. The present exemplary embodiment may be different from the exemplary embodiment described with reference to FIG. 9 in that the first gate insulating layer 130_5 may be formed as multiple layers. Detailed description of the present exemplary embodiment may be the same or substantially the same as that of the exemplary embodiments described above with reference to FIGS. 8 and 9, and thus, redundant description thereof may not be repeated.

Further, in some exemplary embodiments, the device characteristics of the driving transistor DT and the first switching transistor ST1 may be controlled by adjusting the thicknesses of the first gate insulating layer 130 and the second gate insulating layer 160, or the thicknesses of the first active layer 350 and the second active layer 450.

Figure 12:
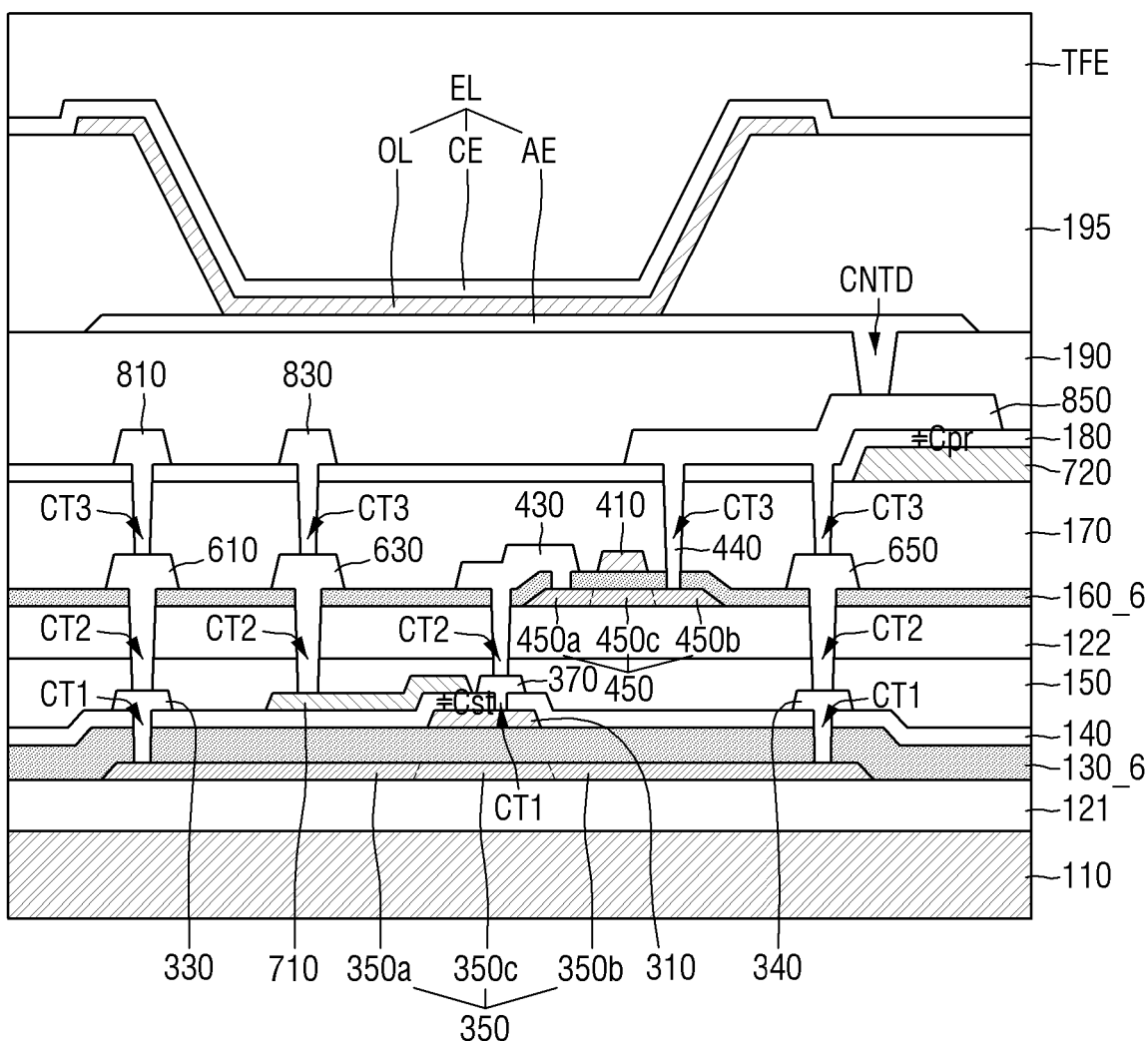
Figure 13:
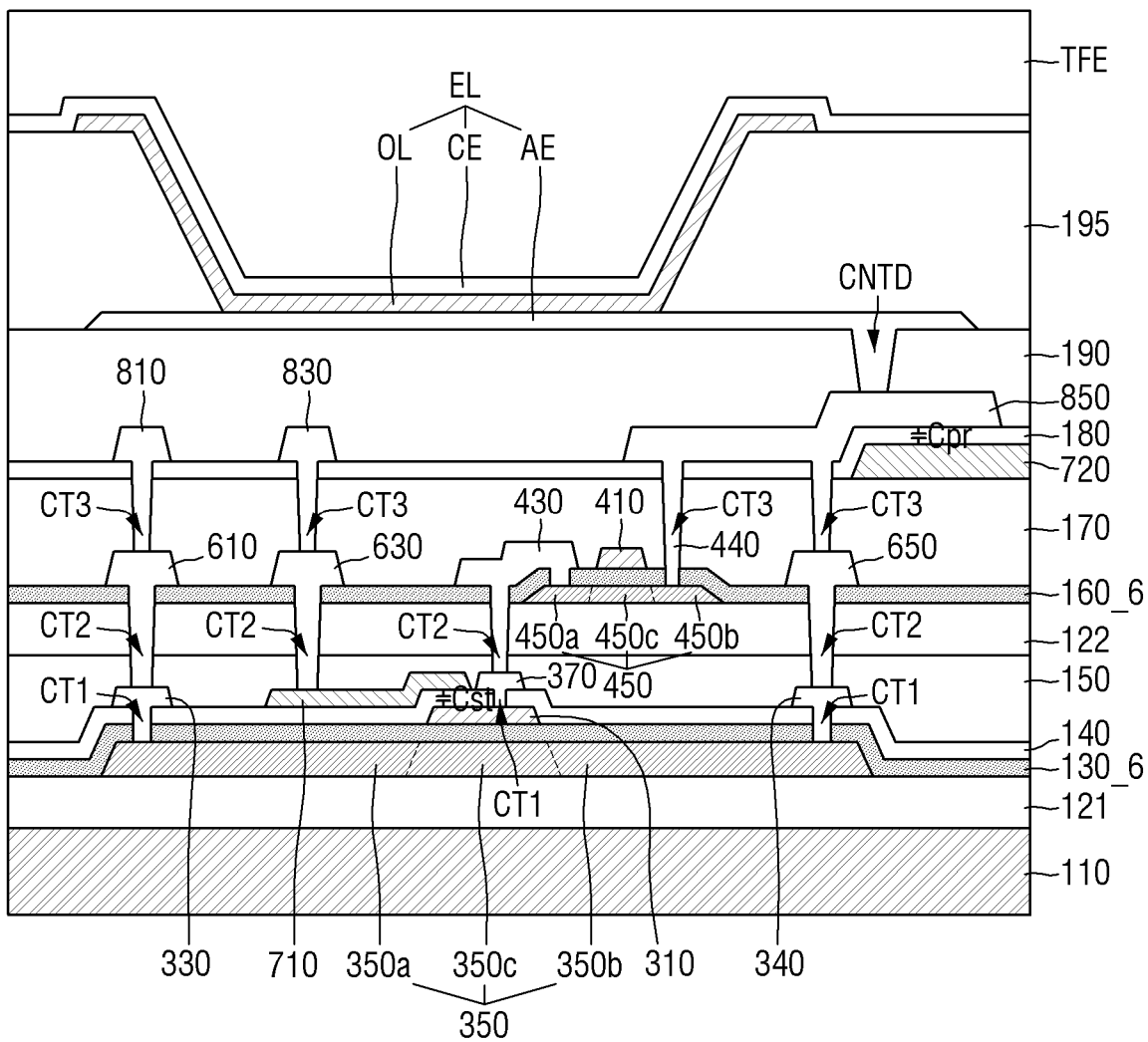

FIGS. 12 and 13 are cross-sectional views illustrating portions of display devices according to various exemplary embodiments.

Referring to FIG. 12, in a display device 1 according to another exemplary embodiment, the thickness (e.g., in the Z-axis direction) of a first gate insulating layer 130_6 may be greater than the thickness (e.g., in the Z-axis direction) of a second gate insulating layer 160_6. The present exemplary embodiment may be different from the exemplary embodiment described with reference to FIG. 5 in that the first gate insulating layer 130_6 and the second gate insulating layer 160_6 may each be formed as a single layer of SiOx, but may have different thicknesses from each other. Hereinafter, the differences from one or more of the above-described embodiments may be mainly described in more detail, and redundant description thereof may not be repeated.

As described above, as a driving transistor DT and a first switching transistor ST1 are disposed at (e.g., in or on) different layers from each other, the first gate insulating layer 130_6 and the second gate insulating layer 160_6 may each be formed by different processes with different physical properties. In the case of the driving transistor DT, as the thickness of the first gate insulating layer 130_6 increases, the controllability of the first gate electrode 310 with respect to the channel region 350c may decrease. However, because the driving transistor DT has a wider channel region 350c than that of the first switching transistor ST1, the controllability of the first gate electrode 310 of the driving transistor DT may be less affected, and a wide range of driving voltages may be secured.

On the other hand, in the case of the first switching transistor ST1, as the thickness of the second gate insulating layer 160_6 decreases, the controllability of the second gate electrode 410 with respect to the channel region 450c may increase. Because the second gate insulating layer 160_6 has a thin thickness, excellent device characteristics may be secured in the first switching transistor ST1, even when the first switching transistor ST1 includes the channel region 450c having a short width.

In FIG. 12, each of the first gate insulating layer 130_6 and the second gate insulating layer 160_6 is illustrated as being formed of a single layer of SiOx, but the present disclosure is not limited thereto. For example, as described above, the first gate insulating layer 130_6 and the second gate insulating layer 160_6 may each be formed as multiple layers by further including a fourth insulating layer 133 and a second insulating layer 163, respectively, each of which is made of SiNx or SiON. Accordingly, redundant description thereof may not be repeated.

Referring to FIG. 13, in a display device 1 according to another exemplary embodiment, the thickness of a first active layer 350 of the driving transistor DT may be greater than the thickness of a second active layer 450 of the first switching transistor ST1. The present exemplary embodiment may be different from the exemplary embodiment described with reference to FIG. 5 in that a first gate insulating layer 130_6 and a second gate insulating layer 160_6 may each be formed as a single layer of SiOx with the same or substantially the same thickness as each other, but the first active layer 350 and the second active layer 450 may have different thicknesses from each other. Hereinafter, the differences from one or more of the above-described embodiments may be mainly described in more detail, and redundant description thereof may not be repeated.

As described above, because the driving transistor DT and the first switching transistor ST1 are disposed at (e.g., in or on) different layers from each other, the first active layer 350 and the second active layer 450 may each be formed by different processes and with different physical properties. In the case of the driving transistor DT, as the thickness of the first active layer 350 increases, a wide range of the driving voltages may be secured, and in the case of the first switching transistor ST1, as the thickness of the second active layer 450 decreases, excellent device characteristics may be secured even when the width of the channel region 450c is shortened.

In FIG. 13, each of the first gate insulating layer 130_6 and the second gate insulating layer 160_6 is illustrated as being formed as a single layer of SiOx, but the present disclosure is not limited thereto. As described above, the first gate insulating layer 130_6 and the second gate insulating layer 160_6 may further include a fourth insulating layer 133 and a second insulating layer 163, respectively, each of which includes (e.g., is made of) SiNx or SiON. Accordingly, redundant description thereof may not be repeated.

The display device 1 may include a larger number of scan signals, and each of the pixels PX may include a larger number of transistors.

Figure 14:
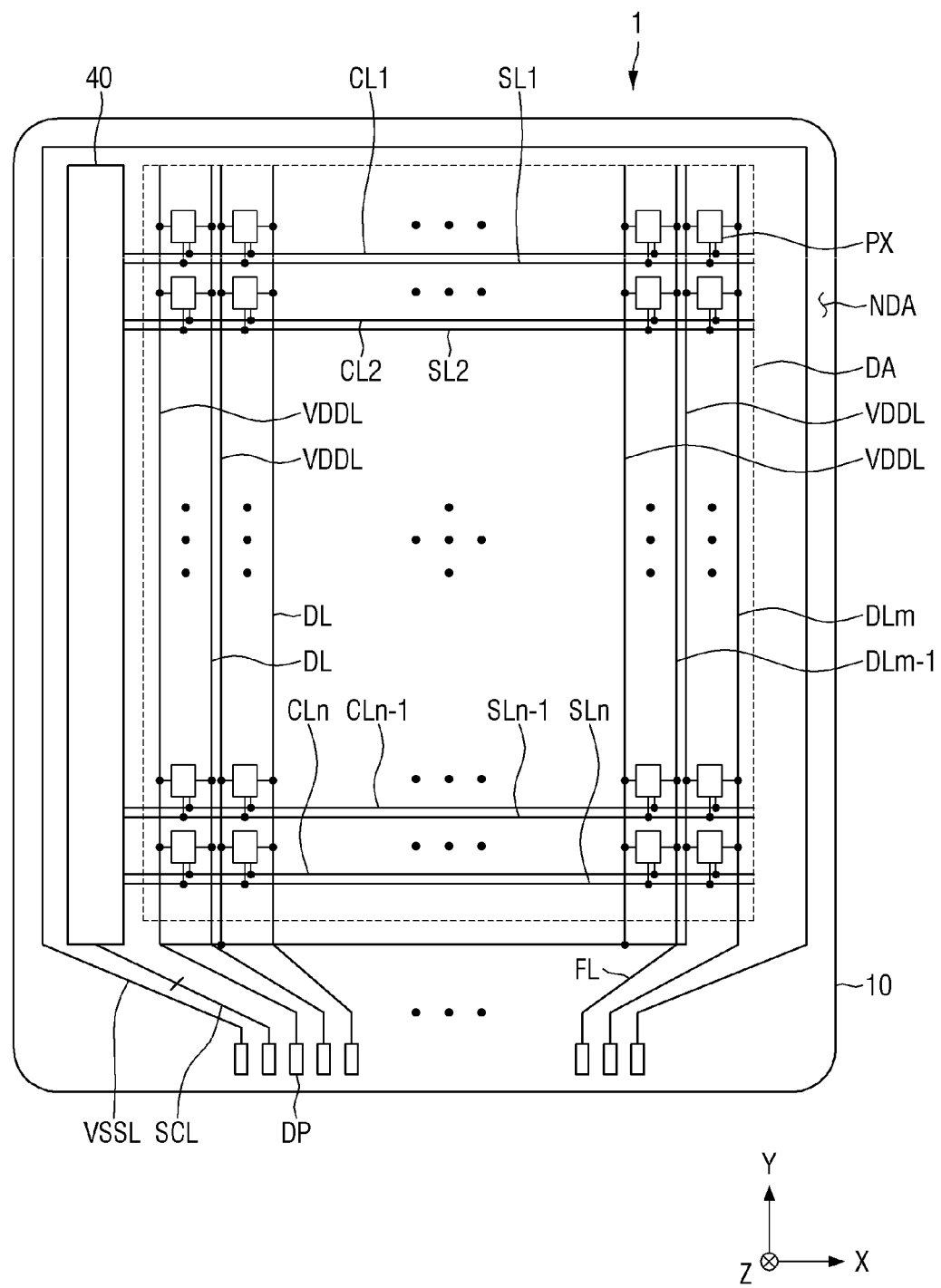
FIG. 14 is a plan view illustrating an example of a display device according to an exemplary embodiment.
Figure 15:
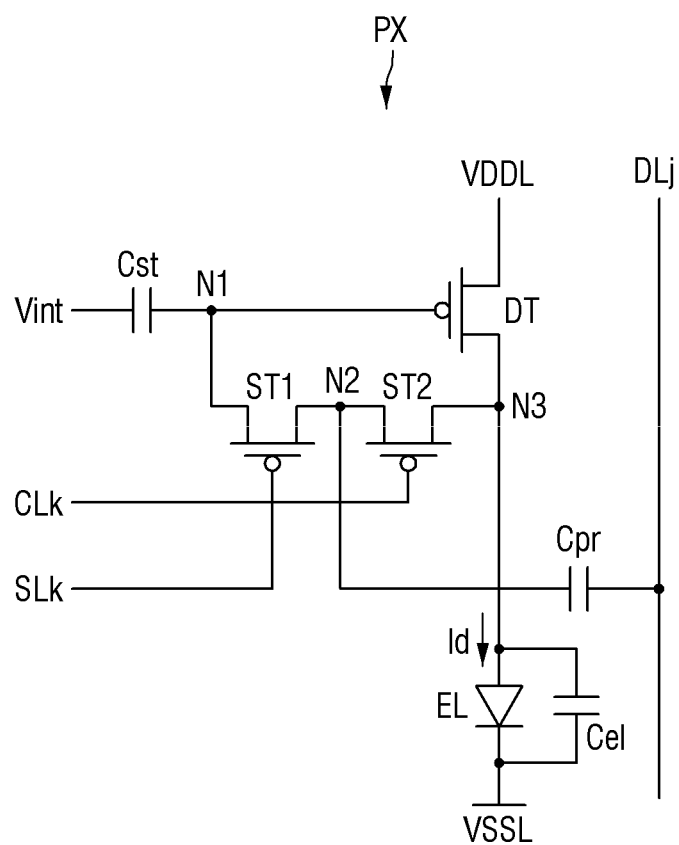
FIG. 15 is an equivalent circuit diagram illustrating a pixel of FIG. 14.

FIG. 14 is a plan view illustrating an example of a display device according to another exemplary embodiment. FIG. 15 is an equivalent circuit diagram illustrating a pixel of FIG. 14.

Referring to FIGS. 14 and 15, control scan lines CL1 to CLn may be further disposed at (e.g., in or on) a display area DA of a display panel 10. The control scan lines CL1 to CLn may be formed to extend in the first direction (e.g., the X-axis direction), and may be parallel to each other. Each of pixels PX may be connected to at least one of the control scan lines CL1 to CLn. Accordingly, each pixel PX may further include one of the control scan lines CL1 to CLn, and a second switching transistor ST2.

The pixel PX of FIG. 15 may be different from that of the exemplary embodiment described with reference to FIG. 4 in that the pixel PX of FIG. 15 further includes a k-th control scan line CLk and the second switching transistor ST2. Hereinafter, the arrangement of the k-th control scan line CLk and the second switching transistor ST2 will be described in more detail, and redundant description of the other components, except for the k-th control scan line CLk and the second switching transistor ST2, may be simplified or may not be repeated.

FIG. 15 illustrates that each pixel PX has a three transistor-two capacitor (3T2C) structure that includes one driving transistor DT, two switching transistors ST1 and ST2, and two capacitors Cst and Cpr.

The driving transistor DT may be disposed between a first voltage line VDDL and a third node N3, a first switching transistor ST1 may be disposed between a first node N1 and a second node N2, and the second switching transistor ST2 may be disposed between the second node N2 and the third node N3.

The second switching transistor ST2 is turned on by a k-th control scan signal of the k-th control scan line CLk, and connects the second node N2 to the third node N3. A gate electrode of the second switching transistor ST2 may be connected to the k-th control scan line CLk, a first electrode of the second switching transistor ST2 may be connected to the third node N3, and a second electrode of the second switching transistor ST2 may be connected to the second node N2.

When both of the first switching transistor ST1 and the second switching transistor ST2 are turned on, a gate electrode and a second electrode of the driving transistor DT are connected to each other, and thus, the driving transistor DT operates as a diode. In other words, when both of the first switching transistor ST1 and the second switching transistor ST2 are turned on, the driving transistor DT may be diode-connected.

The first node N1 may be a contact point between the gate electrode of the driving transistor DT, a first capacitor electrode of the first capacitor Cst, and a second electrode of the first switching transistor ST1. The second node N2 may be a contact point between a first electrode of the first switching transistor ST1, the second electrode of the second switching transistor ST2, and a first capacitor electrode of the second capacitor Cpr. The third node N3 may be a contact point between the second electrode of the driving transistor DT, the first electrode of the second switching transistor ST2, and a first electrode of a light-emitting element EL.

In the exemplary embodiment described with reference to FIG. 15, each pixel PX includes the second switching transistor ST2 disposed between the second node N2 and the third node N3. Accordingly, the second node N2 and the third node N3 may be separated from each other by the second switching transistor ST2, and thus, a data voltage of the j-th data line DLj, which is applied to the gate electrode of the driving transistor DT, is not affected even when a leakage current flowing from the first voltage line VDDL to the third node N3 is generated through the driving transistor DT while the data voltage of the j-th data line DLj is applied to the gate electrode of the driving transistor DT (e.g., the first node N1), thereby preventing or reducing deterioration of display quality.

Furthermore, because the second capacitor Cpr is disposed between the second node N2 and the j-th data line DLj, it may be possible to prevent or reduce a decrease in luminance of the light-emitting element due to a parasitic capacitor of the electrode that overlaps with the first node N1. Thus, the deterioration of the display quality may be prevented or reduced.

Figure 16:
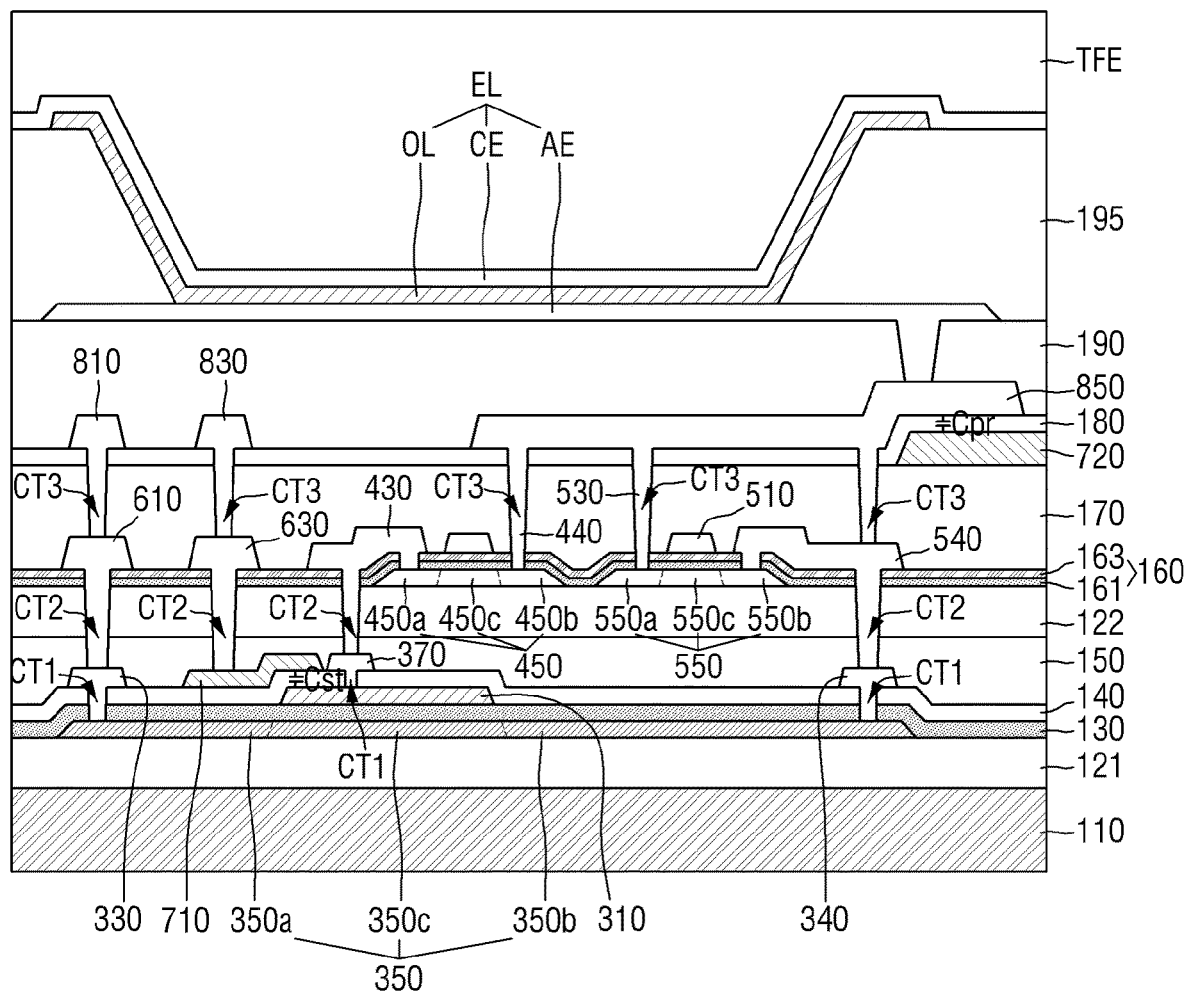
FIG. 16 is a cross-sectional view illustrating a portion of the display device of FIG. 14.

FIG. 16 is a cross-sectional view illustrating a portion of the display device of FIG. 14.

Referring to FIG. 16, the display device 1 may include the driving transistor DT, the first switching transistor ST1, and the second switching transistor ST2. The second switching transistor ST2 includes a third active layer 550, a third gate electrode 510, and source/drain electrodes 530 and 540. The second switching transistor ST2 may be disposed above the driving transistor DT, and may be disposed on the same or substantially the same layer as that of the first switching transistor ST1. Thus, a second gate insulating layer 160 may also be disposed between the third active layer 550 and the third gate electrode 510. The exemplary embodiment described with reference to FIG. 16 may be different from the exemplary embodiment described with reference to FIG. 5 in that the second switching transistor ST2 may be further included. Hereinafter, the differences from one or more of the above-described embodiments may be mainly described in more detail, and redundant description thereof may not be repeated.

In the display device 1 of FIG. 16, a second semiconductor layer further includes the third active layer 550, and a third conductive layer further includes the third gate electrode 510 and a second source/drain electrode 540 of the second switching transistor ST2. In addition, at least a portion of the sixth conductive pattern 850 may be connected to (e.g., may be in contact with) the third active layer 550 through a third contact hole CT3 formed in a second interlayer insulating layer 170 to partially expose an upper surface of the third active layer 550. The region at (e.g., in or on) which the sixth conductive pattern 850 is connected to (e.g., is in contact with) the third active layer 550 may form a first source/drain electrode 530 of the second switching transistor ST2.

In more detail, the third active layer 550 may be disposed on a second buffer layer 122, and may include (e.g., may be made of) polycrystalline silicon, single-crystal silicon, low-temperature polycrystalline silicon, amorphous silicon, or an oxide semiconductor. The third active layer 550 may include a fifth conductive region 550a, a sixth conductive region 550b, and a channel region 550c. The channel region 550c may be disposed between the fifth conductive region 550a and the sixth conductive region 550b. The fifth conductive region 550a and the sixth conductive region 550b may be connected to (e.g., may be in contact with) the first source/drain electrode 530 and the second source/drain electrode 540 of the second switching transistor ST2, respectively, which will be described in more detail below.

The second gate insulating layer 160 may also be disposed on the third active layer 550.

The third conductive layer may further include the third gate electrode 510 and the second source/drain electrode 540 of the second switching transistor ST2. The third gate electrode 510 may overlap with at least a portion of the third active layer 550 with the second gate insulating layer 160 interposed therebetween. For example, as illustrated in FIG. 16, the width of the third gate electrode 510, which is measured in one direction (e.g., the X-axis direction), may be smaller than the width of the third active layer 550, which is measured in the one direction. The third gate electrode 510 may be disposed to overlap with at least the channel region 550c of the third active layer 550, and the width of the third gate electrode 510, which is measured in the one direction, may be equal to or substantially equal to the width of the channel region 550c of the third active layer 550, which is measured in the one direction.

The second source/drain electrode 540 of the second switching transistor ST2 may be connected to (e.g., may be in contact with) the third active layer 550 through a contact hole that partially exposes an upper surface of the sixth conductive region 550b of the third active layer 550. Also, the second source/drain electrode 540 of the second switching transistor ST2 may be connected to (e.g., may be in contact with) a portion of an upper surface of the second source/drain electrode 340 of the driving transistor DT through a second contact hole CT2 that exposes the portion of the upper surface of the second source/drain electrode 340 of the driving transistor DT. In addition, the second source/drain electrode 540 of the second switching transistor ST2 may be connected to (e.g., may be in contact with) the sixth conductive pattern 850, and the driving transistor DT may be electrically connected to a first electrode AE of a light-emitting element EL through the second source/drain electrode 540 and the sixth conductive pattern 850 of the second switching transistor ST2.

At least a portion of the sixth conductive pattern 850 may be connected to (e.g., may be in contact with) the third active layer 550 through the third contact hole CT3 that extends (e.g., passes) through the second interlayer insulating layer 170 and the second gate insulating layer 160 to partially expose the upper surface of the third active layer 550. For example, at least a portion of the sixth conductive pattern 850 may be connected to (e.g., may be in contact with) the fifth conductive region 550a of the third active layer 550, and the portion of the sixth conductive pattern 850 may form the first source/drain electrode 530 of the second switching transistor ST2.

In addition, detailed description of the other components may be the same or substantially the same as those described above with reference to FIG. 5, and thus, redundant description thereof may not be repeated.

The display device 1 according to another exemplary embodiment may include a larger number of transistors.

Figure 17:
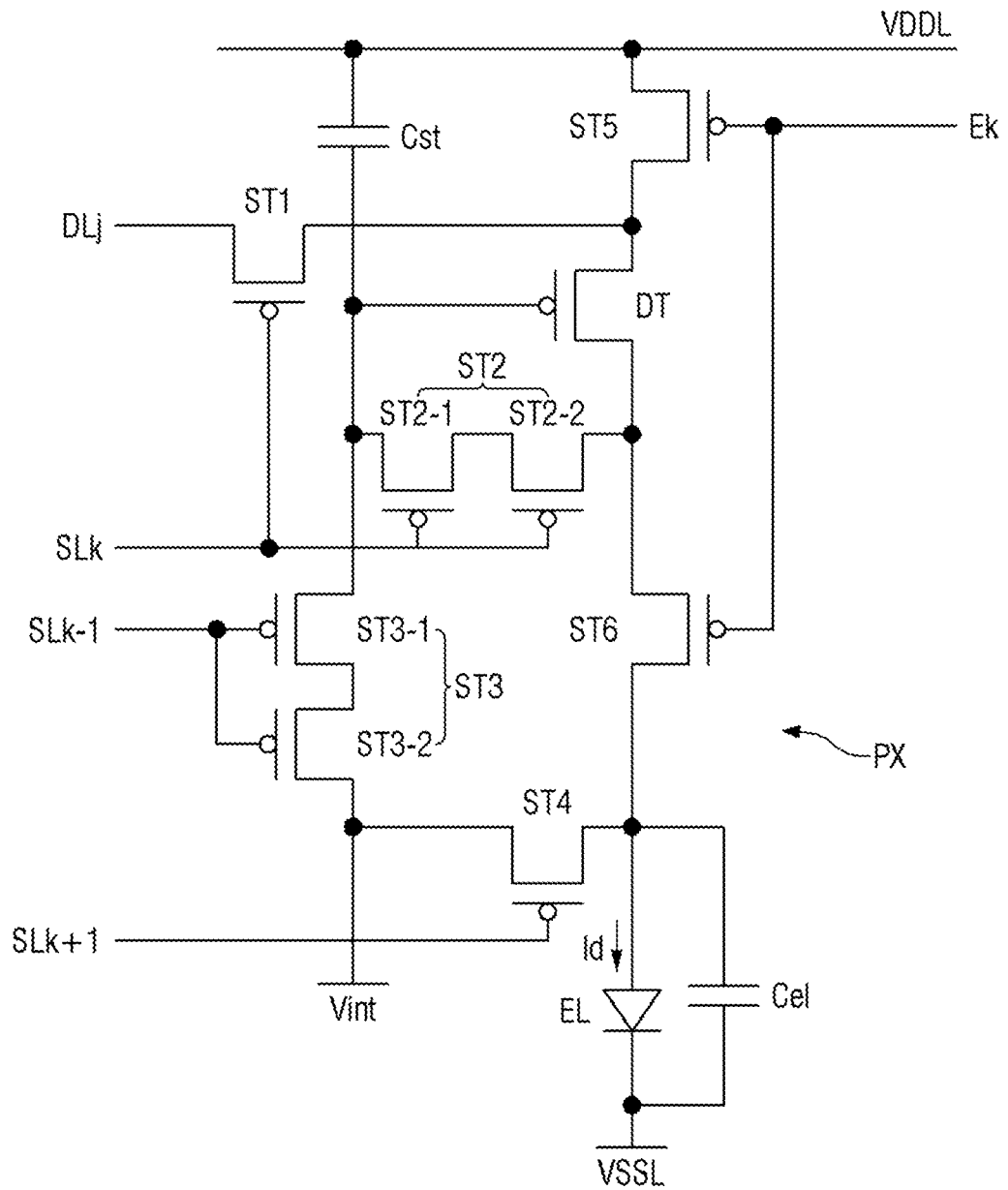
FIG. 17 is an equivalent circuit diagram illustrating a pixel of a display device according to an exemplary embodiment.

FIG. 17 is an equivalent circuit diagram illustrating a pixel of a display device according to another exemplary embodiment.

Referring to FIG. 17, each of pixels PX may include a driving transistor DT, a light-emitting element EL, first to sixth switching transistors ST1, ST2, ST3, ST4, ST5, and ST6, and a first capacitor Cst. In addition, the pixel PX may be connected to a (k−1)-th scan line SLk−1 (where k is a positive integer greater than or equal to 2), a k-th scan line SLk, a (k+1)-th scan line SLk+1, a j-th data line DLj (where j is a positive integer), a first voltage line VDDL to which a first voltage VDD is applied, an initialization voltage line Vint to which an initialization voltage is applied, and the second voltage line VSSL to which the second voltage VSS is applied. In the following, the differences from one or more of the above-described embodiments may be mainly described in more detail, and redundant description thereof may not be repeated.

A first electrode of the light-emitting element EL may be connected to a first electrode of the fourth switching transistor ST4 and a second electrode of the sixth switching transistor ST6. A second electrode of the light-emitting element EL may be connected to the second voltage line VSSL. A parasitic capacitance Cel may be formed between the first electrode and the second electrode of the light-emitting element EL.

The first switching transistor ST1 is turned on by a scan signal of the k-th scan line SLk, and connects a first electrode of the driving transistor DT to the j-th data line DLj. A gate electrode of the first switching transistor ST1 may be connected to the k-th scan line SLk, a first electrode of the first switching transistor ST1 may be connected to the first electrode of the driving transistor DT, and a second electrode of the first switching transistor ST1 may be connected to the data line DLj.

The second switching transistor ST2 may be formed as a dual transistor that includes a (2-1)-th switching transistor ST2-1, and a (2-2)-th switching transistor ST2-2. The (2-1)-th switching transistor ST2-1 and the (2-2)-th switching transistor ST2-2 are turned on by the scan signal of the k-th scan line SLk, and connect a gate electrode and a second electrode of the driving transistor DT to each other. In other words, when the (2-1)-th switching transistor ST2-1 and the (2-2)-th switching transistor ST2-2 are turned on, the gate electrode and the second electrode of the driving transistor DT are connected to each other so that the driving transistor DT operates as a diode (e.g., is diode-connected). A gate electrode of the (2-1)-th switching transistor ST2-1 may be connected to the k-th scan line SLk, a first electrode of the (2-1)-th switching transistor ST2-1 may be connected to a second electrode of the (2-2)-th switching transistor ST2-2, and a second electrode of the (2-1)-th switching transistor ST2-1 may be connected to the gate electrode of the driving transistor DT. A gate electrode of the (2-2)-th switching transistor ST2-2 may be connected to the k-th scan line SLk, a first electrode of the (2-2)-th switching transistor ST2-2 may be connected to the second electrode of the driving transistor DT, and the second electrode of the (2-2)-th switching transistor ST2-2 may be connected to the first electrode of the (2-1)-th switching transistor ST2-1.

The third switching transistor ST3 may be formed as a dual transistor that includes a (3-1)-th switching transistor ST3-1 and a (3-2)-th switching transistor ST3-2. The (3-1)-th switching transistor ST3-1 and the (3-2)-th switching transistor ST3-2 are turned on by a scan signal of the (k−1)-th scan line SLk−1, and connect the gate electrode of the driving transistor DT to the initialization voltage line Vint. The gate electrode of the driving transistor DT may be discharged to have the initialization voltage of the initialization voltage line Vint. A gate electrode of the (3-1)-th switching transistor ST3-1 may be connected to the (k−1)-th scan line SLk−1, a first electrode of the (3-1)-th switching transistor ST3-1 may be connected to the gate electrode of the driving transistor DT, and a second electrode of the (3-1)-th switching transistor ST3-1 may be connected to a first electrode of the (3-2)-th switching transistor ST3-2. A gate electrode of the (3-2)-th switching transistor ST3-2 may be connected to the (k−1)-th scan line SLk−1, the first electrode of the (3-2)-th switching transistor ST3-2 may be connected to the second electrode of the (3-1)-th switching transistor ST3-1, and a second electrode of the (3-2)-th switching transistor ST3-2 may be connected to the initialization voltage line Vint.

The fourth switching transistor ST4 is turned on by a scan signal of the (k+1)-th scan line SLk+1, and connects the first electrode of the light-emitting element EL to the initialization voltage line Vint. The first electrode of the light-emitting element EL may be discharged to have the initialization voltage. A gate electrode of the fourth switching transistor ST4 is connected to the (k+1)-th scan line SLk+1, the first electrode of the fourth switching transistor ST4 is connected to the first electrode of the light-emitting element EL, and a second electrode of the fourth switching transistor ST4 is connected to the initialization voltage line Vint.

The fifth switching transistor ST5 is turned on by an emission control signal of a k-th emission line Ek, and connects the first electrode of the driving transistor DT to the first voltage line VDDL. A gate electrode of the fifth switching transistor ST5 is connected to the k-th emission line Ek, a first electrode of the fifth switching transistor ST5 is connected to the first voltage line VDDL, and a second electrode of the fifth switching transistor ST5 is connected to the first electrode of the driving transistor DT.

The sixth switching transistor ST6 is disposed between the second electrode of the driving transistor DT and the first electrode of the light-emitting element EL. The sixth switching transistor ST6 is turned on by the emission control signal of the k-th emission line Ek, and connects the second electrode of the driving transistor DT and the first electrode of the light-emitting element EL. A gate electrode of the sixth switching transistor ST6 is connected to the k-th emission line Ek, the first electrode of the sixth switching transistor ST6 is connected to the second electrode of the driving transistor DT, and the second electrode of the sixth switching transistor ST6 is connected to the first electrode of the light-emitting element EL. When both the fifth switching transistor ST5 and the sixth switching transistor ST6 are turned on, a driving current Id may be supplied to the light-emitting element EL.

The first capacitor Cst is formed between the gate electrode of the driving transistor DT and the first voltage line VDDL. One electrode of the first capacitor Cst may be connected to the gate electrode of the driving transistor DT, and the other electrode of the first capacitor Cst may be connected to the first voltage line VDDL. The first capacitor Cst may serve to maintain or substantially maintain the voltage of the gate electrode of the driving transistor DT for one frame period.

Although each pixel PX includes the driving transistor DT and a large number of switching transistors ST1, ST2, ST3, ST4, ST5, and ST6, the driving transistor DT and the switching transistors ST1, ST2, ST3, ST4, ST5, and ST6 may be disposed on different layers. Between the active layer and the gate electrode of each of the driving transistor DT and the switching transistors ST1, ST2, ST3, ST4, ST5, and ST6, different gate insulating layers, for example, a first gate insulating layer 130 and a second gate insulating layer 160 may be disposed, and may exhibit different device characteristics. In other words, in the driving transistor DT, the active layer may be disposed on a first buffer layer 121, and the first gate insulating layer 130 may be disposed between the gate electrode and the active layer. In each of the switching transistors ST1, ST2, ST3, ST4, ST5, and ST6, the active layer may be disposed on a second buffer layer 122, and the second gate insulating layer 160 may be disposed between the gate electrode and the active layer. The description thereof may be the same or substantially the same as those described with reference to one or more exemplary embodiments above, and thus, redundant description thereof may not be repeated.

A display device according to one or more exemplary embodiments includes a driving transistor and a switching transistor that are disposed at (e.g., in or on) different layers from each other, and a plurality of gate insulating layers that have different physical properties from each other. The plurality of gate insulating layers may include different insulating materials from each other, or may have different thicknesses from each other, and each of the gate insulating layers may be disposed on an active layer of each of the driving transistor and the switching transistor.

Accordingly, the display device may control device characteristics desired for the driving transistor and the switching transistor by including the gate insulating layers having different physical properties from each other, and thus, in a display device having a high resolution, excellent device characteristics may be secured in transistors disposed at (e.g., in or on) each pixel.

Although various exemplary embodiments of the present disclosure have been described herein, these exemplary embodiments are to be used in a descriptive sense only, and not for purposes of limitation. Accordingly, those skilled in the art will appreciate that various modifications may be made to the exemplary embodiments herein without departing from the spirit and scope of the present invention, as defined in the following claims, and their equivalents.

What is claimed is:

1. A display device comprising:
    a substrate;
    a first buffer layer on the substrate;
    a first semiconductor layer on the first buffer layer comprising a first active layer;
    a first gate insulating layer on the first semiconductor layer and the first buffer layer, and covering the first active layer;
    a first conductive layer on the first gate insulating layer comprising a first gate electrode;
    a second conductive layer on the first conductive layer comprising a first source/drain electrode;
    a first interlayer insulating layer on the first conductive layer;
    a second semiconductor layer on the first interlayer insulating layer comprising a second active layer;
    a second gate insulating layer on the second semiconductor layer covering the second active layer; and
    a third conductive layer on the second gate insulating layer comprising a second gate electrode and a second source/drain electrode,
    wherein the first gate insulating layer and the second gate insulating layer comprise different insulating materials from each other, and
    wherein the first active layer and the second active layer overlap with each other.

2. The display device of claim 1, wherein the first gate insulating layer comprises a single layer comprising silicon oxide, and
    the second gate insulating layer comprises:
        a first insulating layer comprising silicon oxide; and
        a second insulating layer on the first insulating layer, and comprising silicon nitride or silicon oxynitride.

3. The display device of claim 2, wherein the first insulating layer of the second gate insulating layer is in contact with the second active layer.

4. The display device of claim 3, wherein a thickness of the first insulating layer is greater than a thickness of the second insulating layer.

5. The display device of claim 2, wherein the first gate insulating layer comprises:
    a third insulating layer comprising silicon oxide; and
    a fourth insulating layer on the third insulating layer, and comprising silicon nitride or silicon oxynitride.

6. The display device of claim 5, wherein the third insulating layer of the first gate insulating layer is in contact with the first active layer.

7. The display device of claim 5, wherein a hydrogen content of the fourth insulating layer is lower than a hydrogen content of the second insulating layer.

8. The display device of claim 1, wherein a width in one direction of a portion of the first active layer overlapping with the first gate electrode is greater than a width in the one direction of a portion of the second active layer overlapping with the second gate electrode.

9. The display device of claim 8, wherein a thickness of the first gate insulating layer is greater than a thickness of the second gate insulating layer.

10. The display device of claim 8, wherein a thickness of the first active layer is greater than a thickness of the second active layer.

11. The display device of claim 1, further comprising a second buffer layer between the second active layer and the first interlayer insulating layer.

12. The display device of claim 11, wherein the second semiconductor layer further comprises a third active layer on the second buffer layer, and the second gate insulating layer is on the third active layer.

13. The display device of claim 12, wherein the third conductive layer further comprises a third gate electrode and a third source/drain electrode on the second gate insulating layer and overlapping with at least a portion of the third active layer.

14. The display device of claim 1, further comprising a first protective layer between the second conductive layer and the first conductive layer, and between the second conductive layer and the first gate insulating layer, wherein the second conductive layer is on the first protective layer, and further comprises one electrode of a first capacitor at least a portion of which overlaps with the first gate electrode.

15. The display device of claim 14, further comprising:
a second interlayer insulating layer on the third conductive layer;
a data signal line on the second interlayer insulating layer;
a second protective layer on the data signal line; and
a conductive pattern on the second protective layer, and comprising at least a portion that overlaps with the data signal line.

16. A display device comprising:
a substrate;
a first buffer layer on the substrate;
a first semiconductor layer on the first buffer layer comprising a first active layer;
a first gate insulating layer on the first semiconductor layer and the first buffer layer covering the first active layer;
a first conductive layer on the first gate insulating layer comprising a first gate electrode;
a first interlayer insulating layer on the first conductive layer;
a second semiconductor layer on the first interlayer insulating layer comprising a second active layer;
a second gate insulating layer on the second semiconductor layer covering the second active layer; and
a second conductive layer on the second gate insulating layer comprising a second gate electrode,
wherein a thickness of the first gate insulating layer in a portion overlapping the first active layer is greater than a thickness of the second gate insulating layer in a portion overlapping the second active layer.

17. The display device of claim 16, wherein a thickness of the first active layer is greater than a thickness of the second active layer.

18. The display device of claim 17, wherein the first gate insulating layer comprises a single layer comprising silicon oxide, and
the second gate insulating layer comprises:
a first insulating layer comprising silicon oxide; and
a second insulating layer on the first insulating layer, and comprising silicon nitride.

19. The display device of claim 18, wherein the second insulating layer of the second gate insulating layer comprises silicon oxynitride.

20. A display device comprising:
a substrate;
a driving transistor on the substrate comprising a first active layer, a first gate electrode, and a first source/drain electrode;
a first interlayer insulating layer on the driving transistor;
a first switching transistor on the first interlayer insulating layer comprising a second active layer, a second gate electrode, and a second source/drain electrode;
a first gate insulating layer between the first active layer and the first gate electrode; and
a second gate insulating layer between the second active layer and the second gate electrode,
wherein a width in one direction of a channel region of the first active layer is greater than a width in the one direction of a channel region of the second active layer, and
a dielectric constant of the first gate insulating layer is lower than a dielectric constant of the second gate insulating layer.

* * * * *